(12) United States Patent
Fujikawa

(10) Patent No.: US 12,099,277 B2
(45) Date of Patent: Sep. 24, 2024

(54) ELECTRO-OPTICAL DEVICE COMPRISING A PLURALITY OF TERMINALS HAVING A PLURALITY OF RECESSED PORTIONS INCLUDING FIRST AND SECOND RECESSED PORTIONS AND ELECTRONIC APPARATUS

(71) Applicant: SEIKO EPSON CORPORATION, Tokyo (JP)

(72) Inventor: Shinsuke Fujikawa, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 18/329,592

(22) Filed: Jun. 6, 2023

(65) Prior Publication Data
US 2023/0314882 A1    Oct. 5, 2023

Related U.S. Application Data

(63) Continuation of application No. 17/870,854, filed on Jul. 22, 2022, now Pat. No. 11,714,321, which is a
(Continued)

(30) Foreign Application Priority Data

Aug. 26, 2020 (JP) .................. 2020-142423

(51) Int. Cl.
*G02F 1/1345* (2006.01)
*G02F 1/13363* (2006.01)

(52) U.S. Cl.
CPC ........ *G02F 1/13452* (2013.01); *G02F 1/1345* (2013.01); *G02F 1/13454* (2013.01);
(Continued)

(58) Field of Classification Search
CPC ..... H05K 2203/048; H05K 2201/0278; H05K 2201/0224; G02F 1/13456
See application file for complete search history.

(56) References Cited

U.S. PATENT DOCUMENTS

| 9,990,085 B2 | 6/2018 | Kobayashi |
| 11,428,999 B2 | 8/2022 | Fujikawa |

(Continued)

FOREIGN PATENT DOCUMENTS

| JP | 2007080522 | 3/2007 |
| JP | 2016225295 | 12/2016 |

(Continued)

OTHER PUBLICATIONS

"Notice of Allowance of Parent U.S. Appl. No. 17/412,234", issued on Apr. 22, 2022, p. 1-p. 12.
(Continued)

*Primary Examiner* — Paul C Lee
(74) *Attorney, Agent, or Firm* — JCIPRNET

(57) ABSTRACT

An electro-optical device includes: a liquid crystal panel; a particle aligned type anisotropic conductive film having a plurality of electrically conductive particles that are arranged in a state of being aligned along a first direction and a second direction intersecting with the first direction; and a printed circuit board coupled to a connection terminal portion of the liquid crystal panel via the particle aligned type anisotropic conductive film, wherein the connection terminal portion includes a plurality of connection terminals, a plurality of recessed portions that are arranged in a state of being aligned along a third direction and a fourth direction intersecting with the third direction are formed on a surface of the connection terminal, and at least one of the first direction and the second direction along which the electrically conductive particles are arranged is different in arrangement direction from both the third direction and the fourth direction.

11 Claims, 24 Drawing Sheets

Related U.S. Application Data continuation of application No. 17/412,234, filed on Aug. 25, 2021, now Pat. No. 11,428,999.

(52) U.S. Cl.
CPC ...... *G02F 1/13456* (2021.01); *G02F 1/13458* (2013.01); *G02F 1/13363* (2013.01)

(56) References Cited

U.S. PATENT DOCUMENTS

| | | |
|---|---|---|
| 2004/0257516 A1 | 12/2004 | Sugimoto et al. |
| 2006/0006543 A1 | 1/2006 | Shimazu et al. |
| 2012/0118480 A1 | 5/2012 | Paik et al. |
| 2012/0299888 A1 | 11/2012 | Kim et al. |
| 2014/0319554 A1 | 10/2014 | Lee |
| 2016/0381801 A1 | 12/2016 | Saruyama et al. |
| 2017/0271293 A1 | 9/2017 | Heo et al. |
| 2018/0011369 A1* | 1/2018 | An .................. G02B 5/3083 |
| 2018/0277505 A1* | 9/2018 | Hayashi .................. C09J 7/10 |

FOREIGN PATENT DOCUMENTS

| | | |
|---|---|---|
| JP | 2020038993 | 3/2020 |
| WO | 2016002279 | 1/2016 |

OTHER PUBLICATIONS

"Office Action of Parent U.S. Appl. No. 17/870,854", issued on Nov. 25, 2022, p. 1-p. 20.

\* cited by examiner

ELECTRO-OPTICAL DEVICE COMPRISING A PLURALITY OF TERMINALS HAVING A PLURALITY OF RECESSED PORTIONS INCLUDING FIRST AND SECOND RECESSED PORTIONS AND ELECTRONIC APPARATUS

This application is a continuation application of and claims the priority benefit of a U.S. application Ser. No. 17/870,854, filed on Jul. 22, 2022, now allowed. The prior application Ser. No. 17/870,854 is a continuation application of and claims the priority benefit of a U.S. application Ser. No. 17/412,234, filed on Aug. 25, 2021, now patented as U.S. Pat. No. 11,428,999 B2, which is based on, and claims priority from Japan Application Ser. No. 2020-142423, filed on Aug. 26, 2020. The entirety of each of the above-mentioned patent applications is hereby incorporated by reference herein and made a part of this specification.

BACKGROUND

1. Technical Field

The present disclosure relates to an electro-optical device and an electronic apparatus.

2. Related Art

As the electro-optical device, there has been known an active drive type liquid crystal device that includes switching elements each provided for each pixel. For example, such a liquid crystal device is used as a light valve of a projector as an electronic apparatus.

The liquid crystal device includes a liquid crystal panel having a display region in which a plurality of pixels are arranged. A flexible wiring substrate (flexible printed circuit: FPC) is coupled to connection terminals of the liquid crystal panel via an anisotropic conductive film (ACF). A drive signal and a drive voltage are supplied to the liquid crystal panel through the flexible wiring substrate.

Recently, along with the miniaturization and a demand for high definition of a liquid crystal device and other electronic apparatus, an attempt to make a pitch of connection terminals fine has been in progress, and an anisotropic conductive film is also requested to follow such an attempt to make the pitch fine.

However, when electrically conductive particles are filled in the anisotropic conductive film at high density in order to ensure the electrical conduction also in a narrow space between connection terminals in a state where the electrically conductive particles are sandwiched between the connection terminals with certainty, a rate of occurrence of short circuiting between terminals is increased since the electrically conductive particles dispersed between the connection terminals are continuously arranged.

In view of such circumstances, there has been developed an anisotropic conductive film capable of preventing the occurrence of short circuiting between the terminals that is caused by such continuously arranged electrically conductive particles in a space between the connection terminals that are disposed at a fine pitch. As an anisotropic conductive film adaptable to such a fine pitch, for example, JP-A-2020-38993 discloses an anisotropic conductive film in which electrically conductive particles are regularly arranged in a state of being aligned in a predetermined arrangement pattern (hereinafter, referred to as a particle aligned type anisotropic conductive film).

Further, there has been known that a plurality of recessed portions are formed on a surface of the connection terminal. This is because, at the connection terminal, recesses are generated in the connection structure between an electrode layer that is brought into contact with the conductive particles and a wiring layer below the electrode layer. The process of forming the recessed portions is described in detail later.

However, when a panel size is miniaturized without changing the resolution of the liquid crystal panel or when the resolution is increased without changing the panel size, it is necessary to optimize sizes such as a width and a length and a connection terminal pitch of connection terminals for connection with an external printed circuit board such as a flexible wiring substrate corresponding to narrowing of a connection terminal region brought about by the miniaturization of the panel size and the increase of the number of connection terminals brought about by higher resolution. When a particle aligned anisotropic conductive film is used, there is a drawback that, among the plurality of arranged connection terminals, there appears a connection terminal where a large number of electrically conductive particles fall into recessed portions so that a pressing force is not properly applied to the electrically conductive particles at the time of performing compression bonding of the flexible wiring substrate whereby the electrically conductive particles are not collapsed properly thus deteriorating the electrical connection performance.

SUMMARY

An electro-optical device includes: an electro-optical panel, an anisotropic conductive film having a plurality of electrically conductive particles that are arranged in a state of being aligned along a first direction and a second direction intersecting with the first direction as viewed in plan view; and a printed circuit board coupled to a connection terminal portion of the electro-optical panel via the anisotropic conductive film, wherein the connection terminal portion includes a plurality of terminals, a plurality of recessed portions that are arranged in a state of being aligned along a third direction and a fourth direction intersecting with the third direction are formed on a surface of each terminal, and at least one of the arrangement directions of the electrically conductive particles along the first direction and the second direction differs from both arrangement directions of the recessed portions along the third direction and the fourth direction.

An electronic apparatus includes the electro-optical device described above.

DESCRIPTION OF EXEMPLARY EMBODIMENTS

First Embodiment

Figure 1:
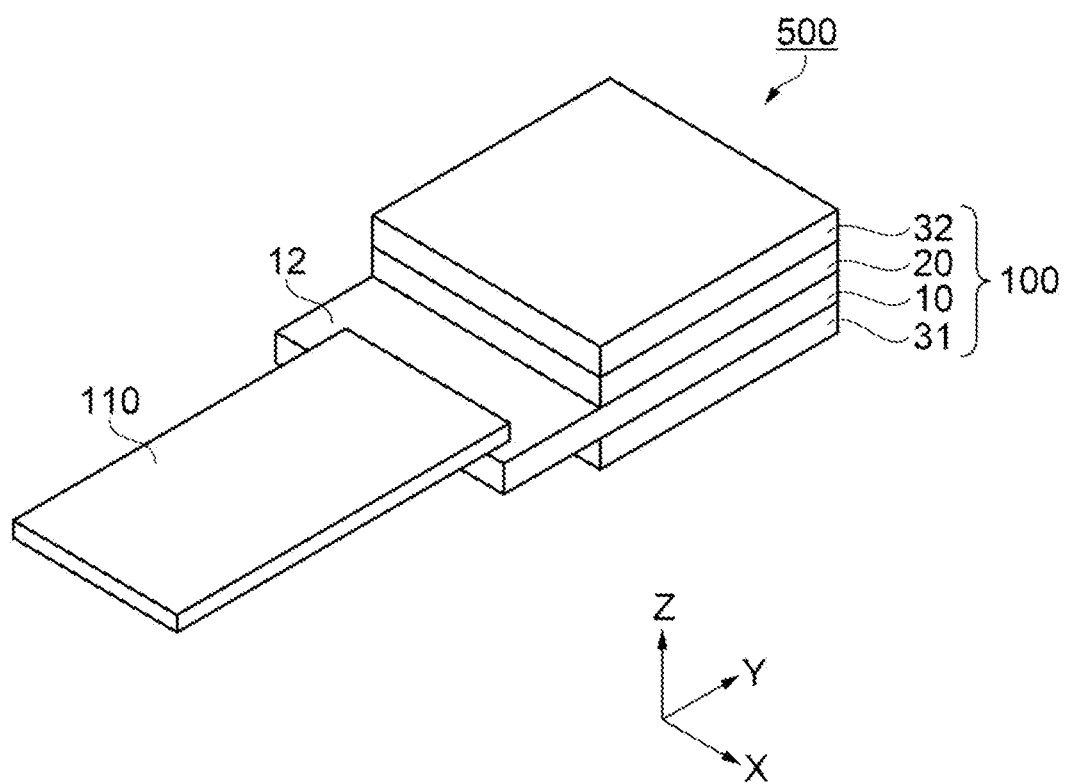
FIG. 1 is a perspective view illustrating a configuration of a liquid crystal device.
Figure 2:
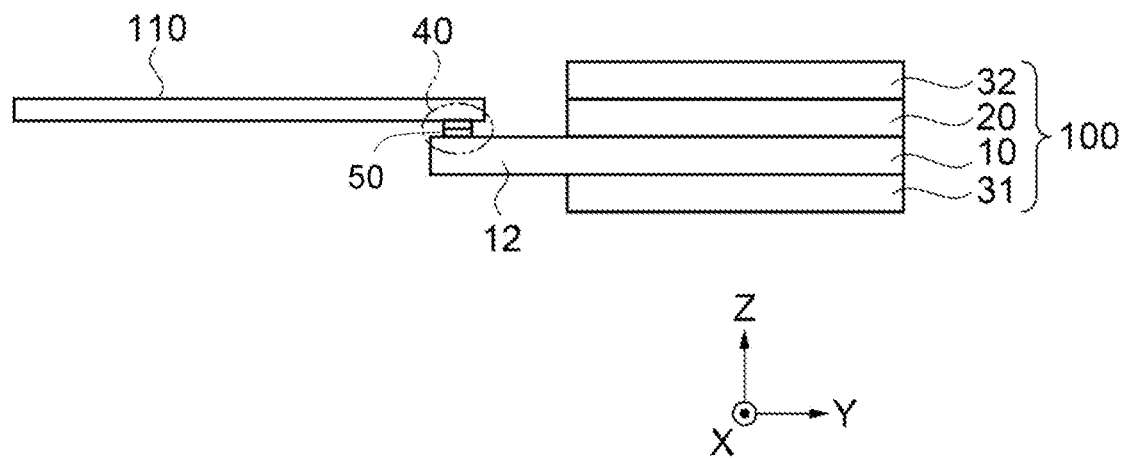
FIG. 2 is a side view illustrating the configuration of the liquid crystal device illustrated in FIG. 1.

As illustrated in FIG. 1 and FIG. 2, a liquid crystal device 500 that forms an electro-optical device includes a liquid crystal panel 100 as an electro-optical panel, and a printed circuit board 110 that is coupled to one side of the liquid crystal panel 100. Here, in FIG. 1 and FIG. 2, the description of some constitutional elements is omitted when appropriate provided that such omission of the description does not obstruct the description of the configuration, the manner of operation, and the advantageous effects of the present disclosure. For example, the liquid crystal device 500 is used as a light valve of a projector 1000 as an electronic apparatus described later.

Hereinafter, for the sake of convenience of the description, the description is made using an X axis, a Y axis, and a Z axis that are orthogonal to each other when necessary. A direction along the X axis is described as an X direction. In the same manner, a direction along the Y axis is described as a Y direction. A direction along the Z axis is described as a Z direction. Additionally, in the following description, an extending direction of a long side of a connection terminal 50 of a connection terminal portion 40 is described as a Y direction, and an extending direction of a short side of the connection terminal 50 is described as an X direction, and "viewing the connection terminal portion in a Z direction" is described as "as viewed in plan view".

The liquid crystal panel 100 includes a plurality of pixels that are arranged in a matrix array in the X direction and the Y direction in a display region, and the description of the plurality of pixels is omitted. The liquid crystal panel 100 is an active drive type liquid crystal panel.

Although not illustrated in the drawings, in respective pixels, a pixel electrode, a switching element, a counter electrode, a holding capacitor and the like are provided correspondingly. The switching element is configured to control switching of the pixel electrode. The counter electrode faces the pixel electrode via a liquid crystal layer. The pixel electrodes, the switching elements, and the holding capacitors are mounted on an element substrate 10. For example, the switching element is a thin film transistor (TFT). The counter electrode is mounted on a counter substrate 20 at least over the display region such that the counter electrode faces the plurality of pixel electrodes. The pixel electrodes and the counter electrode are each formed using a transparent conductive film made of indium tin oxide (ITO), indium zinc oxide (IZO) or the like, for example.

A connection terminal portion 40 is disposed on an overhang portion 12 of the element substrate 10. The connection terminal portion 40 is a portion where connection terminals 50a and 50b (see FIG. 3) that form terminals disposed on the liquid crystal panel 100 and external terminals 111a, 111b (see FIG. 9) formed on the printed circuit board 110 are respectively electrically coupled to each other via a particle aligned type anisotropic conductive film (ACF) 70 (see FIG. 3). For example, the printed circuit board 110 is a flexible board such as a flexible wiring substrate (flexible printed circuit: FPC). Here, a driving integrated circuit (IC) for driving the liquid crystal panel 100 may be mounted on the printed circuit board 110.

As illustrated in FIG. 1 and FIG. 2, a first dustproof substrate 31 is disposed on an element substrate 10 side of the liquid crystal panel 100. A second dustproof substrate 32 is disposed on a counter substrate 20 side of the liquid crystal panel 100.

Figure 3:
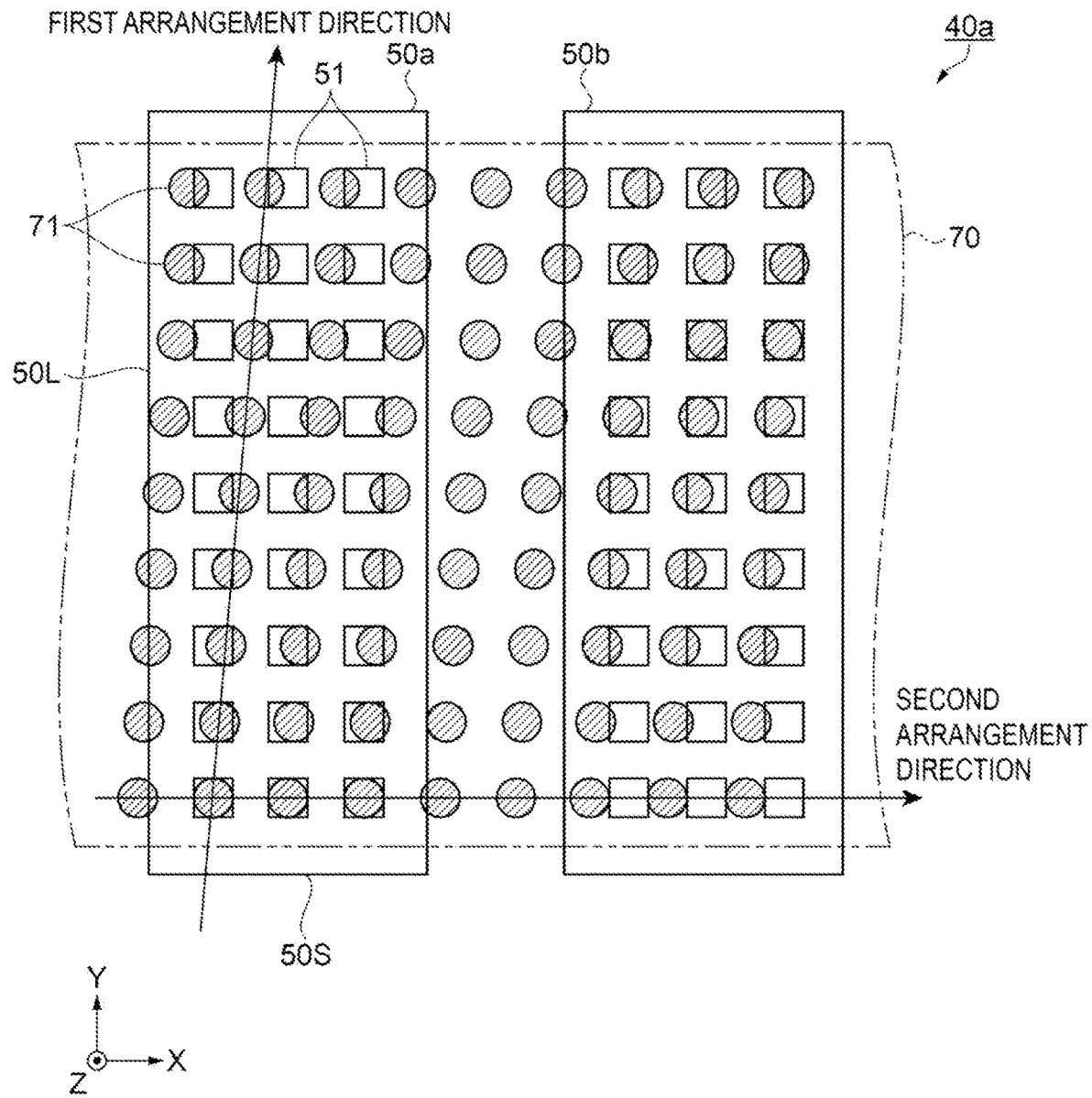
FIG. 3 is a plan view illustrating a configuration of a connection terminal portion according to a first embodiment.

As illustrated in FIG. 3, a connection terminal portion 40a is mounted on the overhang portion 12 of the element substrate 10 (see FIG. 1 and FIG. 2). The connection terminal portion 40a has the first connection terminal 50a that is one of the connection terminals, and a second connection terminal 50b adjacent to the first connection terminal 50a and is one of the connection terminals. Typically, a plurality of the connection terminals 50a (50b) are arranged at equal intervals in the X direction, for example. Further, a plurality of recessed portions 51 are formed in a lattice shape and at equal intervals along the X direction and the Y direction on surfaces of the first connection terminal 50a and the second connection terminal 50b, that is, on an electrode layer that is configured to contact electrically conductive particles 71 attributed to the connection structure between the electrode layer and a wiring layer below the electrode layer. As described above, a state where the plurality of recessed portions 51 are arranged in a lattice shape and at equal intervals along the X direction and the Y direction can be paraphrased as a state where the plurality of recessed portions 51 are arranged in a state of being aligned. Further, the particle aligned type anisotropic conductive film 70 is adhered to the first connection terminal 50a and the second connection terminal 50b. In FIG. 3, the illustration of the printed circuit board 110 is omitted. Here, in the present embodiment, the X direction corresponds to the third direction, and the Y direction corresponds to the fourth direction.

The recesses 51 are formed because of the following reasons. The electrode layer that is brought into contact with the electrically conductive particles 71 of the first connection terminal 50a (second connection terminal 50b) is stacked on the wiring layer disposed below the electrode layer via an insulating film. For example, the wiring layer disposed below the electrode layer is used for lines coupled to electrodes of holding capacitors of the pixels, and lines for the pixels and switching elements disposed in a peripheral circuit. In forming the connection structure, the wiring layer disposed below the electrode layer is exposed by forming openings in the insulating film using a photo etching technique. Each opening may have a size of approximately several $\mu m^2$ in order to ensure the electrical connection between the electrode layer and the wiring layer with certainty. Next, the electrode layer made of ITO is formed by sputtering as a film that covers the openings. A film thickness of the electrode layer is approximately 0.2 μm, for example. The electrode layer is formed in the same process where ITO films of the pixel electrodes are formed, for example. Since the film thickness of the electrode layer is thin compared to the size of the opening, the openings cannot be filled with the electrode layer. Accordingly, the recessed portions 51 are formed on the surface of the first connection terminal 50a (second connection terminal 50b), that is, on the electrode layer configured to contact the electrically conductive particle 71. Further, to provide a large number of connection structures in order to ensure the electrical connection with certainty, the plurality of recessed portions 51 are formed.

Further, the reason for forming the recessed portions 51 is not limited to the provision of the connection structure between the electrode layer that is configured to contact the electrically conductive particles 71 and the wiring layer that is disposed below the electrode layer. For example, there is a case where two wiring layers are disposed below the electrode layer configured to contact the electrically conductive particles 71, and the connection structure between these two wiring layers is formed by the formation of the recessed portions. In this case, when an insulating layer above the wiring layers is removed and the electrode layer configured to contact the electrically conductive particles 71 is formed, there may be a case where the recessed portions 51 are formed so as to reflect the recessed portions of the connection structure.

With respect to the formation of the connection structure, there is a method that forms a plug structure where small openings are formed and a film made of tungsten is formed on and filled in the openings by sputtering and, then, a surface of the structural body is flattened. However, the method has a drawback that a manufacturing cost is increased due to the addition of a tungsten sputtering step and a polishing step.

In the first connection terminal 50a, a length of a long side 50L extending along the Y direction is 500 μm, for example, and a length of a short side 50s extending along the X direction is 30 μm, for example. The number of first connection terminals 50a is 200, for example. A pitch between the recessed portion 51 and the recessed portion 51 is approximately 10 μm in both directions of the X direction and the Y direction, for example. In the first connection terminal 50a, a distance from the short side 50S to the recessed portion 51 is 4 μm, for example. A size of each recessed portion 51 is 2 μm×2 μm, for example. A gap between the first connection terminal 50a and the second connection terminal 50b is 15 μm, for example. In this embodiment, the size of the first connection terminal 50a and the size of the second connection terminal 50b are equal.

The electrically conductive particles 71 of the particle aligned type anisotropic conductive film 70 are regularly arranged in a predetermined arrangement pattern as viewed in plan view. For example, as illustrated in FIG. 3, the electrically conductive particles 71 are arranged in a lattice shape and at equal intervals along a column direction (first arrangement direction) and a row direction (second arrangement direction). A state where the plurality of electrically conductive particles 71 are arranged in a lattice shape and at equal intervals along the first arrangement direction and the second arrangement direction in this manner can be also referred to as a state where the plurality of electrically conductive particles 71 are arranged in a state of being aligned. In the present embodiment, the first arrangement direction corresponds to the first direction, and the second arrangement direction corresponds to the second direction.

In an example illustrated in FIG. 3, the first arrangement direction indicating the arrangement direction of the electrically conductive particles 71 of the particle aligned type anisotropic conductive film 70 in the column direction intersects with the long side 50L of the first connection terminal 50a, and the electrically conductive particles 71 are arranged in a regular arrangement pattern so as to be aligned along the first arrangement direction. Here, the second arrangement direction indicating the arrangement direction of the electrically conductive particles 71 of the particle aligned type anisotropic conductive film 70 in the row direction is not inclined with respect to the short side 50S of the first connection terminal 50a, and the electrically conductive particles 71 are arranged parallel to the short side 50S of the first connection terminal 50a along the second arrangement direction. That is, the first arrangement direction along which the electrically conductive particles 71 are arranged and the Y direction along which the recessed portions 51 are arranged are different from each other, and these directions intersect with each other. The arrangement pitch of the electrically conductive particles 71 is 10 μm, for example. A diameter of each electrically conductive particle 71 is 3 μm, for example.

For example, the electrically conductive particles 71 are each formed of a core material, a metal coating covering the core material, and an insulating resin layer covering the metal coating. Since the electrically conductive particles 71 are each formed by being coated with the insulating resin layer, even when the electrically conductive particles 71 are arranged at a fine pitch, a short circuiting due to aggregation of the electrically conductive particles 71 minimally occurs. However, for enabling the electrical connection, it is necessary to break the insulating resin film by applying proper pressing to the electrically conductive particles 71. Accordingly, when there is the difference among gaps between the connection terminals 50a (50b) and the external terminals of the printed circuit board 110, with respect to the electrically conductive particles 71 arranged at a wide gap area, a sufficient pressing is not applied to the electrically conductive particles 71 so that the electrically conductive particles 71 cannot break the insulating resin film whereby an electrical connection failure is likely to occur (see FIG. 26). When an excessive pressing force is applied, the electrically conductive particles 71 at a narrow gap area are excessively collapsed and lose elasticity. As a result, the reliability of the electrical connection is impaired. In view of the above, a configuration for decreasing the number of electrically conductive particles 71 falling into the recessed portions 51 is required (see FIG. 25).

Accordingly, by arranging the recessed portions 51 and the electrically conductive particles 71 as described above, it is possible to suppress the falling of the large number of electrically conductive particles 71 into the recessed portions 51. In addition, the same goes also for the first connection terminal 50a and the second connection terminal 50b adjacent to each other. Accordingly, when the printed circuit board 110 is adhered to the connection terminal portion 40a via the particle aligned type anisotropic conductive film 70 by compression bonding, it is possible to suppress the falling of the large number of electrically conductive particles 71 into the recessed portions 51. Therefore, it is possible to suppress the lowering of the electrical connection performance of the connection terminal portion 40a brought about by the insufficient pressing to the electrically conductive particles 71.

Figure 4:
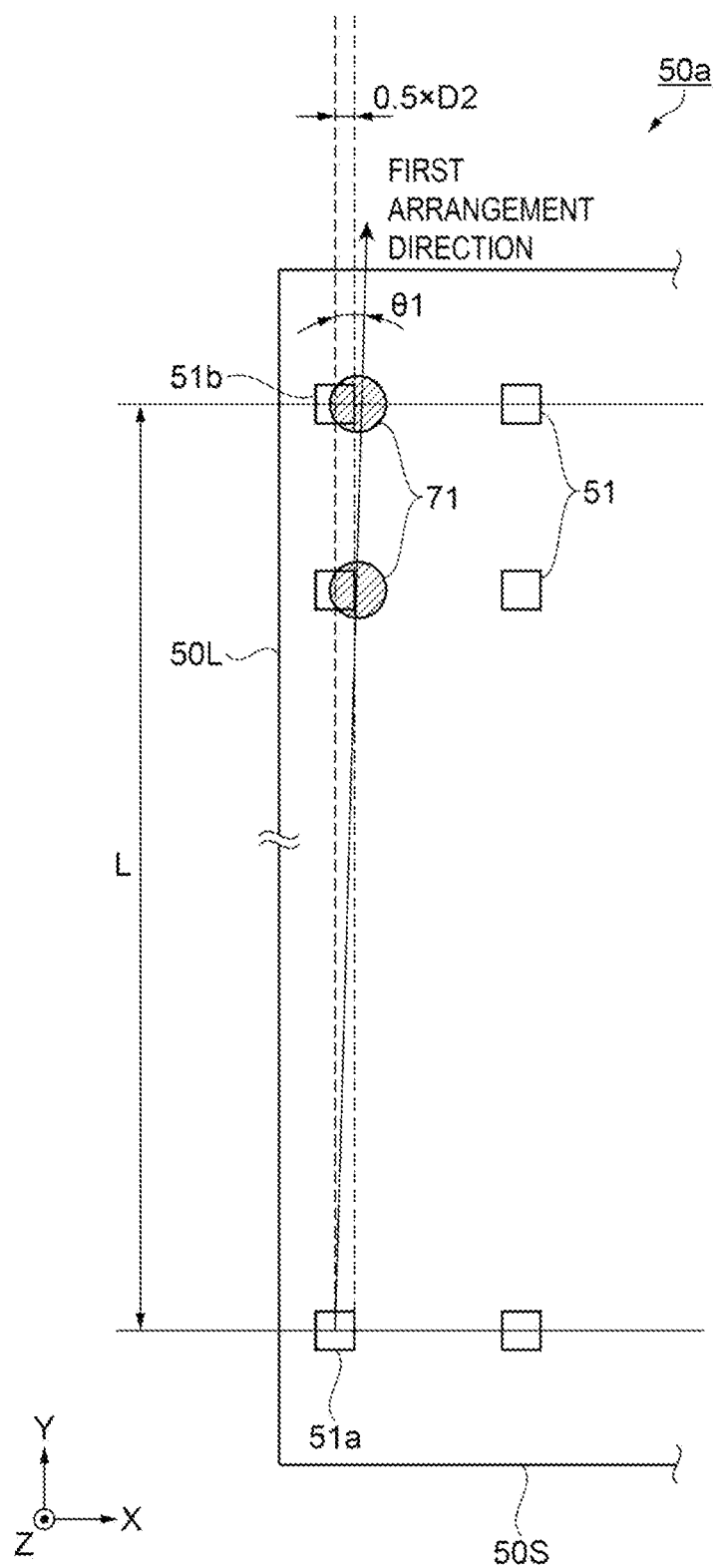
FIG. 4 is a plan view for explaining an angle of a first arrangement direction.
Figure 5:
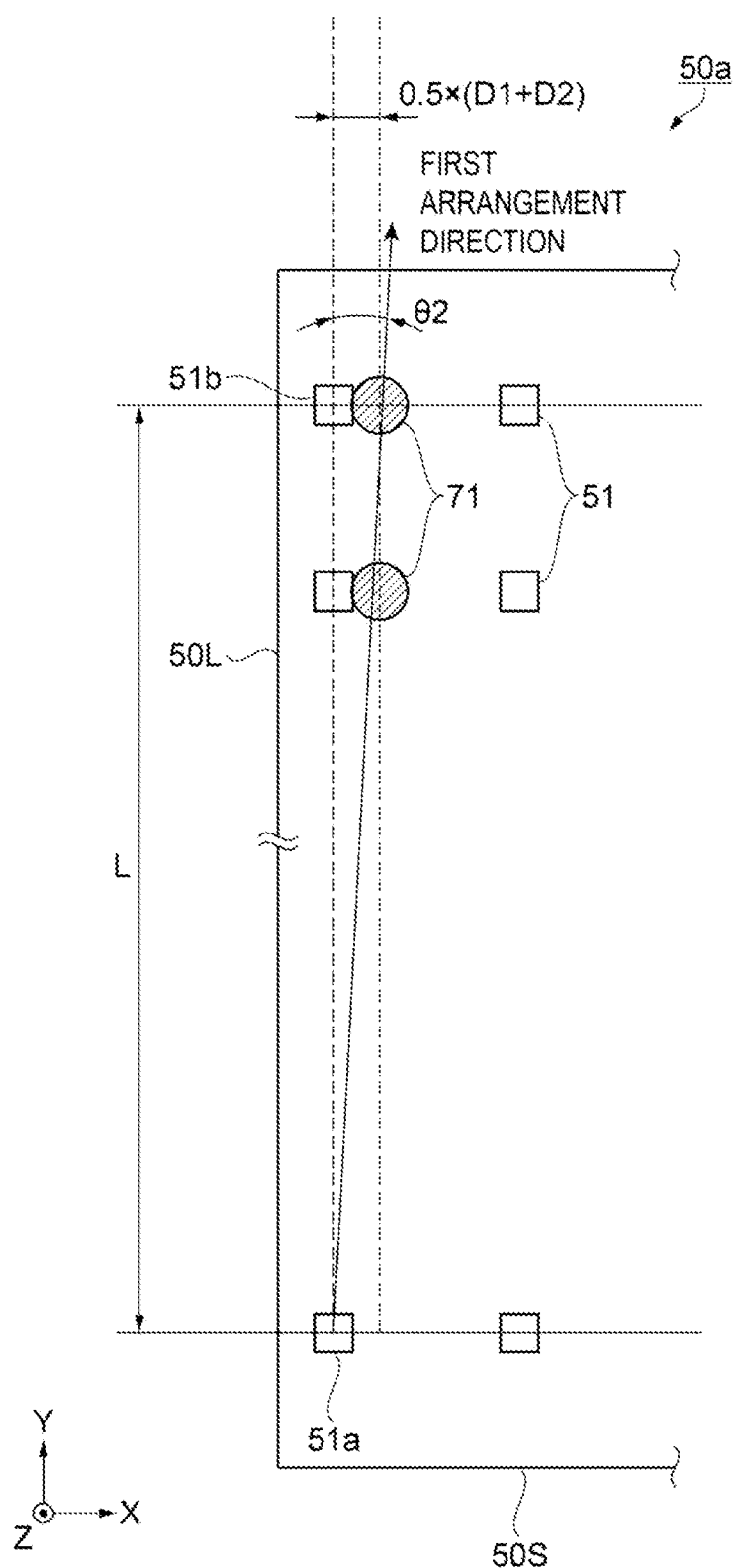
FIG. 5 is a plan view for explaining the angle of the first arrangement direction.

FIG. 4 and FIG. 5 are views for explaining a preferred angle of the first arrangement direction. As illustrated in FIG. 4, an angle made by intersection of the Y direction along which the recessed portions 51 are arranged along the long side 50L of the first connection terminal 50a and the first arrangement direction along which the electrically conductive particles 71 are arranged is assumed as θ1. A length between the recessed portions 51 at both ends of the long side 50L of the first connection terminal 50a, that is, a length from the recessed portion 51a disposed at an outermost end on one end side of the long side 50L to the recessed portion 51b disposed at an outermost end on the other end side of the long side 50L in the same column as the recessed portion 51a is assumed as L. A width of the recessed portion 51 (including the recessed portions 51a, 51b) is assumed as D2. In this case, the angle θ1 may be set to satisfy the following formula 1.

$$\text{Tan } \theta 1 \geq 0.5 \times D2/L \quad \text{(formula 1)}$$

By disposing the recessed portions 51 and the electrically conductive particles 71 so as to satisfy the above-mentioned condition, in a certain column of the electrically conductive particles 71, at least one electrically conductive particle 71 can be prevented from falling into the recessed portion 51 (including the recessed portion 51a, 51b) and hence, proper pressing can be applied to the electrically conductive particles 71. Accordingly, the first connection terminal 50a and the printed circuit board 110 can be electrically coupled to each other.

In FIG. 4, although the formula 1 is proposed on the premise that the electrically conductive particle 71 agrees with the recessed portion 51a in position, in an actual configuration, there may be a case where the electrically conductive particle 71 does not agree with the recessed portion 51a in position. For example, when the conductive particle 71 is displaced leftward with respect to the recessed portion 51a by 0.25×D2, there is a risk that the conductive particles 71 are mostly fall into the recessed portions 51 respectively in the whole region from the recessed portion 51a to the recessed portion 51b. Taking such a case into consideration, it is preferable to set the angle θ1 so as to satisfy the relationship of Tan θ1≥D2/L by expanding the formula 1. In such a manner, at least one electrically conductive particle 71 can be prevented from falling into the recessed portion 51 (including the recessed portion 51a, 51b) and hence, proper pressing can be applied to the electrically conductive particles 71.

Further, as illustrated in FIG. 5, an angle made by intersection of the Y direction along which the recessed portions 51 are arranged along the long side 50L of the first connection terminal 50a and the first arrangement direction along which the electrically conductive particles 71 are arranged is assumed as θ2. A length from the recessed portion 51a on one end of the long side 50L of the first connection terminal 50a to the recessed portion 51b on the other end of the long side 50L of the first connection portion 50a is assumed as L. An average diameter of the conductive particles 71 is assumed as D1. The width of the recessed portions 51 (including the recessed portions 51a, 51b) is assumed as D2. In this case, the angle θ2 may be set to satisfy the following formula 2.

$$\text{Tan } \theta 2 \geq 0.5 \times (D1+D2)/L \quad \text{(formula 2)}$$

By disposing the recessed portions 51 (including the recessed portions 51a, 51b) and the electrically conductive particles 71 so as to satisfy the above-mentioned condition, in a certain column of the electrically conductive particles 71, the plurality of electrically conductive particles 71 can be prevented from falling into the recessed portions 51 (including the recessed portions 51a, 51b) and hence, proper pressing can be applied to the electrically conductive particles 71. Accordingly, the first connection terminal 50a and the printed circuit board 110 can be electrically coupled to each other in a more stable manner.

Figure 6:
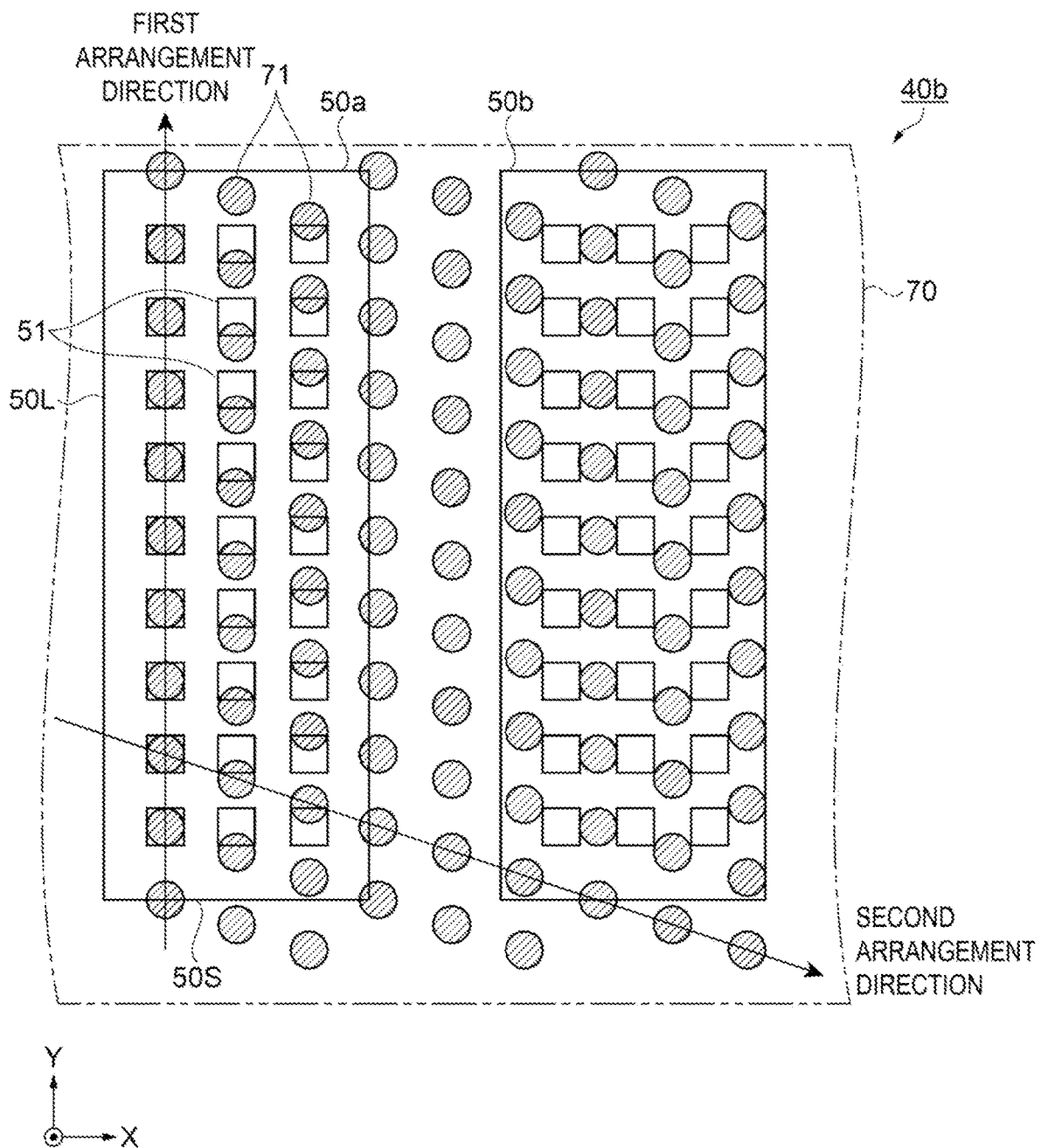
FIG. 6 is a plan view illustrating the configuration of the connection terminal portion of the liquid crystal device.

In the example illustrated in FIG. 6, the first arrangement direction indicating the arrangement direction of the electrically conductive particles 71 of the particle aligned type anisotropic conductive film 70 in the column direction is equal to the extending direction of the long side 50L of the first connection terminal 50a, and the electrically conductive particles 71 are arranged parallel to the direction along the long side 50L of the first connection terminal 50a, that is, the Y direction without inclination. On the other hand, the second arrangement direction indicating the arrangement direction of the electrically conductive particles 71 of the particle aligned type anisotropic conductive film 70 in the row direction differs from the extending direction of the short side 50S of the first connection terminal 50a, and the electrically conductive particles 71 are regularly arranged along the second arrangement direction. That is, the second arrangement direction along which the electrically conductive particles 71 are arranged and the X direction along which the recessed portions 51 are arranged differ from each other and intersect with each other.

By arranging the recessed portions 51 and the electrically conductive particles 71 as described above, it is possible to suppress the falling of the large number of electrically conductive particles into the recessed portions 51. In addition, the same goes also for the first connection terminal 50a and the second connection terminal 50b adjacent to each other. Accordingly, when the printed circuit board 110 is adhered to the connection terminal portion 40b via the particle aligned type anisotropic conductive film 70 by compression bonding, it is possible to suppress the falling of the large number of electrically conductive particles 71 into the recessed portions 51. Therefore, it is possible to suppress the lowering of the electrical connection performance of the connection terminal portion 40b brought about by insufficient pressing to the electrically conductive particles 71.

Figure 7:
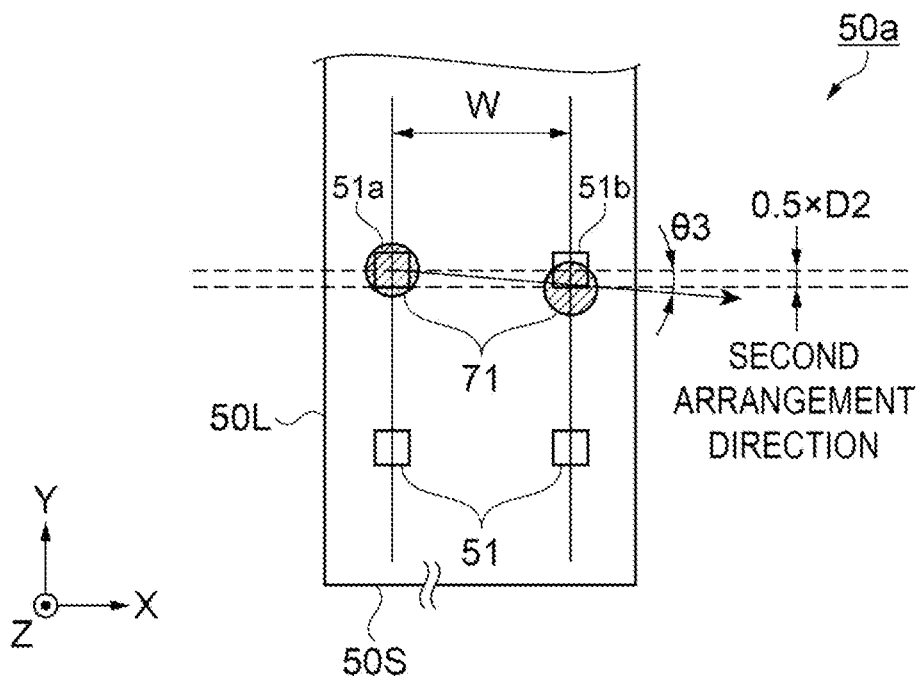
FIG. 7 is a plan view for explaining an angle of a second arrangement direction.
Figure 8:
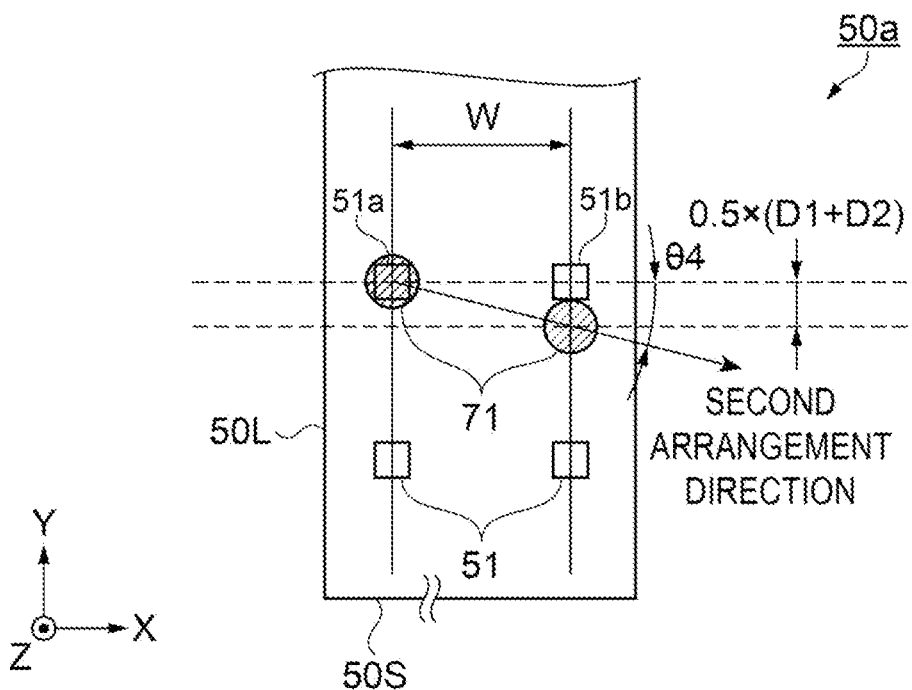
FIG. 8 is a plan view for explaining the angle of the second arrangement direction.

FIG. 7 and FIG. 8 are views for explaining a preferred angle of the second arrangement direction in the example illustrated in FIG. 6. As illustrated in FIG. 7, an angle made by an intersection of the X direction along which the recessed portions 51 are arranged along the short side 50S of the first connection terminal 50a and the second arrangement direction along which the electrically conductive particles 71 are arranged is assumed as θ3. A length between the recessed portions 51 at both ends of the short side 50S of the first connection terminal 50a, that is, a length from the recessed portion 51a disposed at an outermost end on one end side of the short side 50S to the recessed portion 51b disposed at an outermost end on the other end side of the short side 50S is assumed as W. A width of each recessed portion 51 is assumed as D2. In this case, the angle θ3 may be set to satisfy the following formula 3.

$$\text{Tan } \theta3 \geq 0.5 \times D2/W \quad \text{(formula 3)}$$

By disposing the recessed portions 51 and the electrically conductive particles 71 so as to satisfy the above-mentioned condition, in a certain row of the electrically conductive particles 71, at least one electrically conductive particle 71 can be prevented from falling into the recessed portion 51 and hence, proper pressing can be applied to the electrically conductive particles 71. Accordingly, the first connection terminal 50a and the printed circuit board 110 can be electrically coupled to each other.

Here, in FIG. 7, although the formula 3 is proposed on the premise that the electrically conductive particle 71 agrees with the recessed portion 51a in position, in an actual configuration, there may be a case where the electrically conductive particle 71 does not agree with the recessed portion 51a in position. For example, when the conductive particle 71 is displaced upward with respect to the recessed portion 51a by 0.25×D2, there is a risk that the conductive particles 71 mostly fall into the recessed portions 51 respectively in the whole region from the recessed portion 51a to the recessed portion 51b. Taking such a case into consideration, it is preferable to set the angle θ3 so as to satisfy the relationship of Tan θ3≥D2/W by expanding the formula 3. With such a configuration, at least one electrically conductive particle 71 can be prevented from falling into the recessed portion 51 (including the recessed portion 51a, 51b) and hence, proper pressing can be applied to the electrically conductive particles 71.

As illustrated in FIG. 8, an angle made by an intersection of the X direction along which the recessed portions 51 are arranged along the short side 50S of the first connection terminal 50a and the second arrangement direction along which the electrically conductive particles 71 are arranged is assumed as θ4. A length between the recessed portions 51 at both ends of the short side 50S of the first connection terminal 50a, that is, a length from the recessed portion 51a disposed at an outermost end on one end side of the short side 50S to the recessed portion 51b disposed at an outermost end on the other end side of the short side 50S is assumed as W. An average diameter of the conductive particles 71 is assumed as D1. A width of each recessed portion 51 is assumed as D2. In this case, the angle θ4 may be set to satisfy the following formula 4.

$$\text{Tan } \theta4 \geq 0.5 \times (D1+D2)/W \quad \text{(formula 4)}$$

By disposing the recessed portions 51 and the electrically conductive particles 71 so as to satisfy the above-mentioned condition, in a certain row of the electrically conductive particles 71, the plurality of electrically conductive particles 71 can be prevented from falling into the recessed portions 51 respectively and hence, proper pressing can be applied to the electrically conductive particles 71. Accordingly, the first connection terminal 50a and the printed circuit board 110 can be electrically coupled to each other in a more stable manner.

Figure 9:
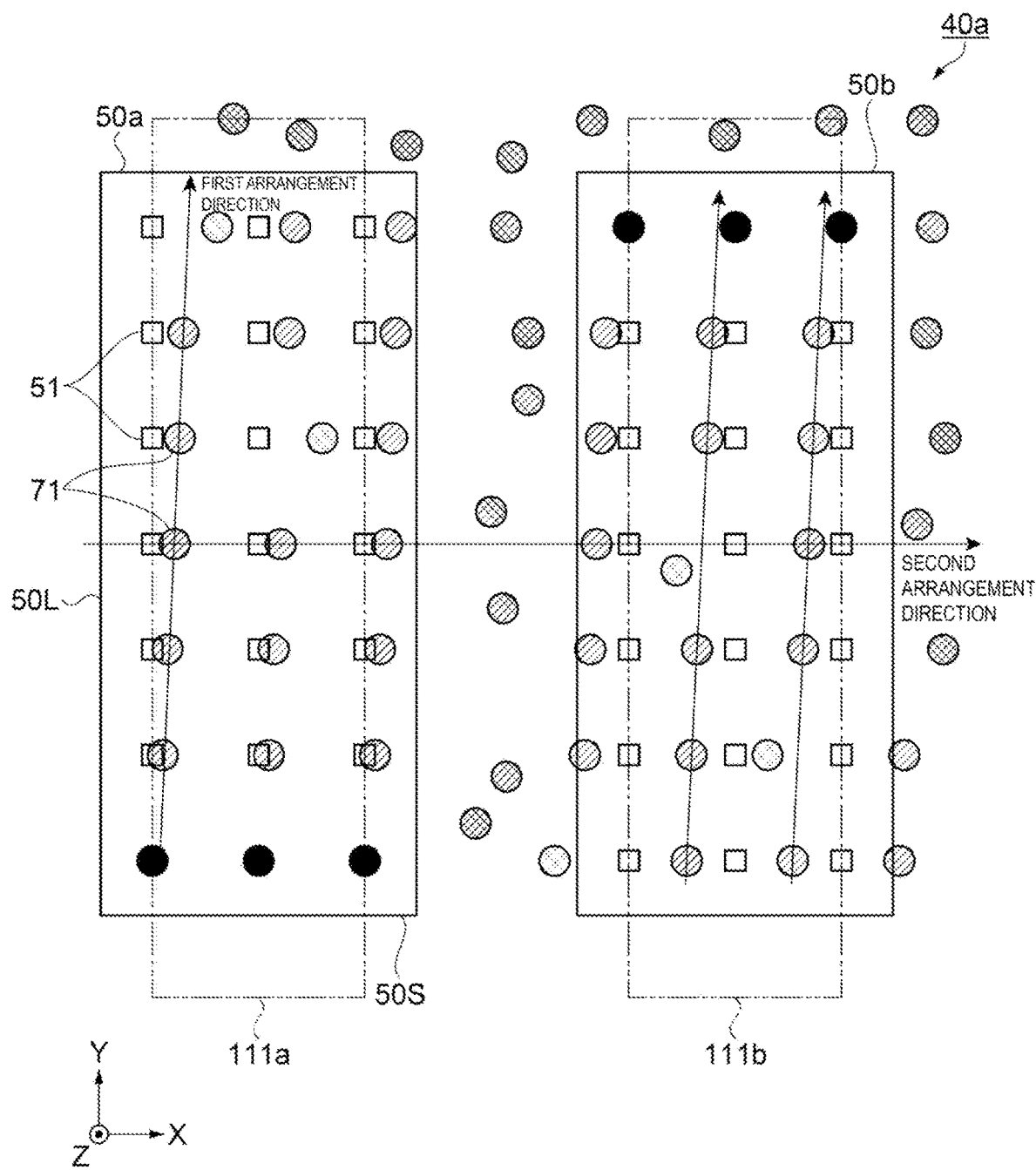
FIG. 9 is a plan view illustrating a state of the connection terminal portion after compression bonding.
Figure 10:
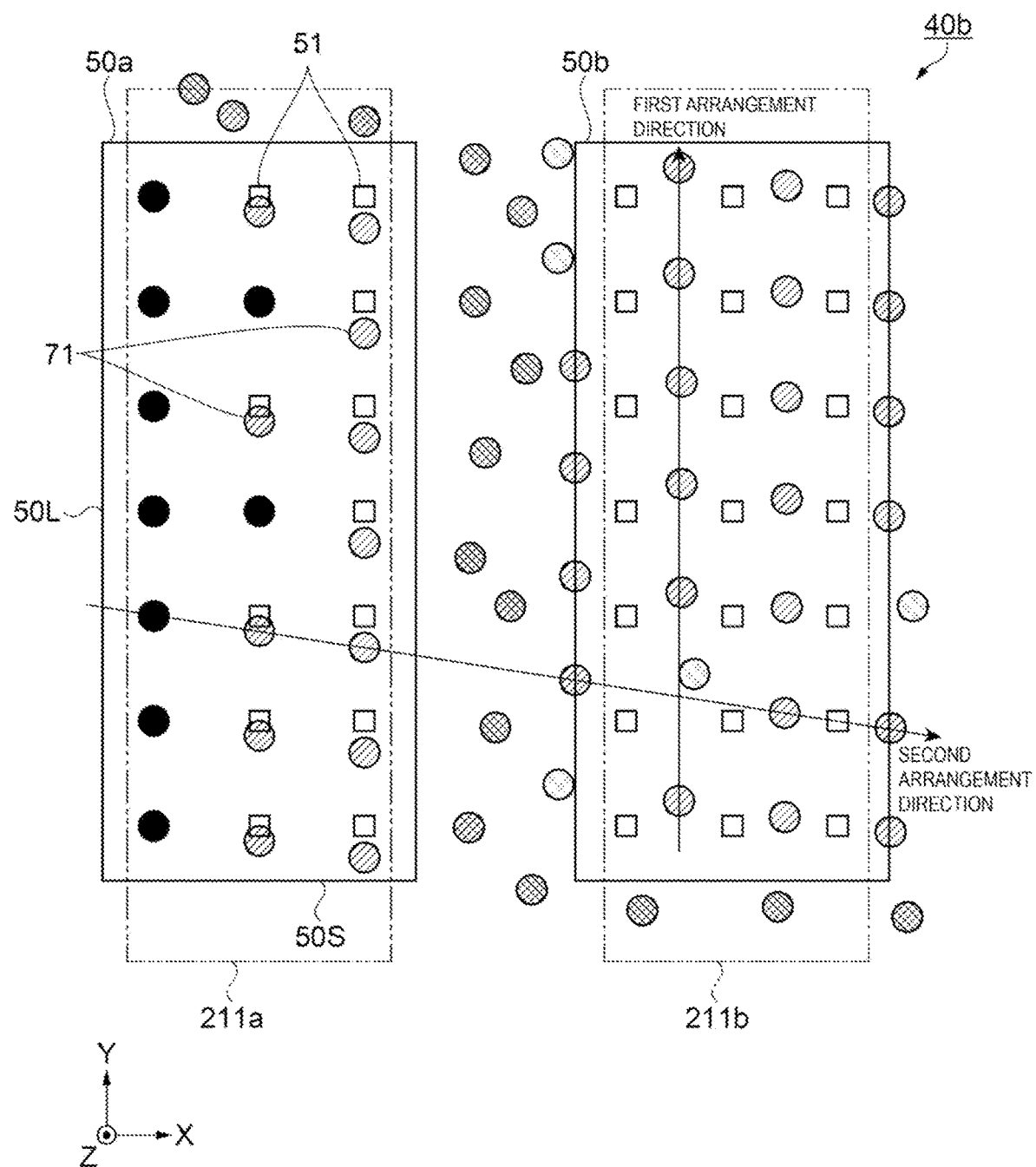
FIG. 10 is a plan view illustrating a state of the connection terminal portion after compression bonding.

FIG. 9 and FIG. 10 are plan views illustrating the positional relationship between the recessed portions 51 and the electrically conductive particles 71 after the printed circuit board 110 is adhered to the connection terminals 40a, 40b by compression bonding via the particle aligned type anisotropic conductive film 70. FIG. 9 corresponds to FIG. 3, and is a plan view illustrating the positional relationship between the recessed portions 51 and the electrically conductive particles 71 after the compression bonding of the printed circuit board 110 via the particle aligned type anisotropic conductive film 70. FIG. 10 corresponds to FIG. 6, and is a plan view illustrating the positional relationship between the recessed portions 51 and the electrically conductive particles 71 after the compression bonding of the printed circuit board 110 via the particle aligned type anisotropic conductive film 70.

As illustrated in FIG. 9 and FIG. 10, the electrically conductive particles 71 may be slightly displaced from the alignment in the first arrangement direction and the second arrangement direction that are the arrangement directions of the electrically conductive particles 71 at the time of compression bonding of the printed circuit board 110.

Figure 25:
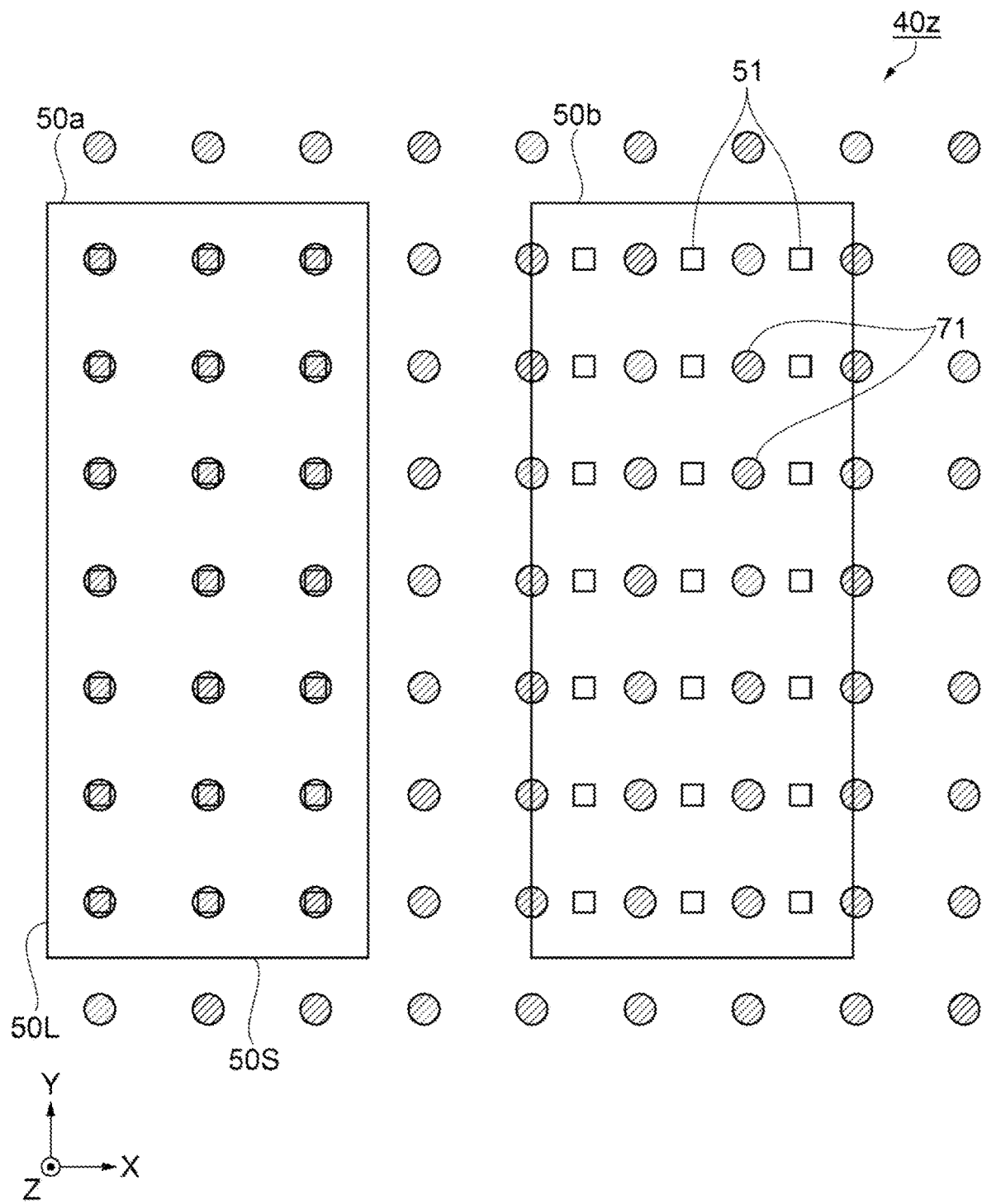
FIG. 25 is a plan view illustrating a configuration of a known connection terminal portion.
Figure 26:
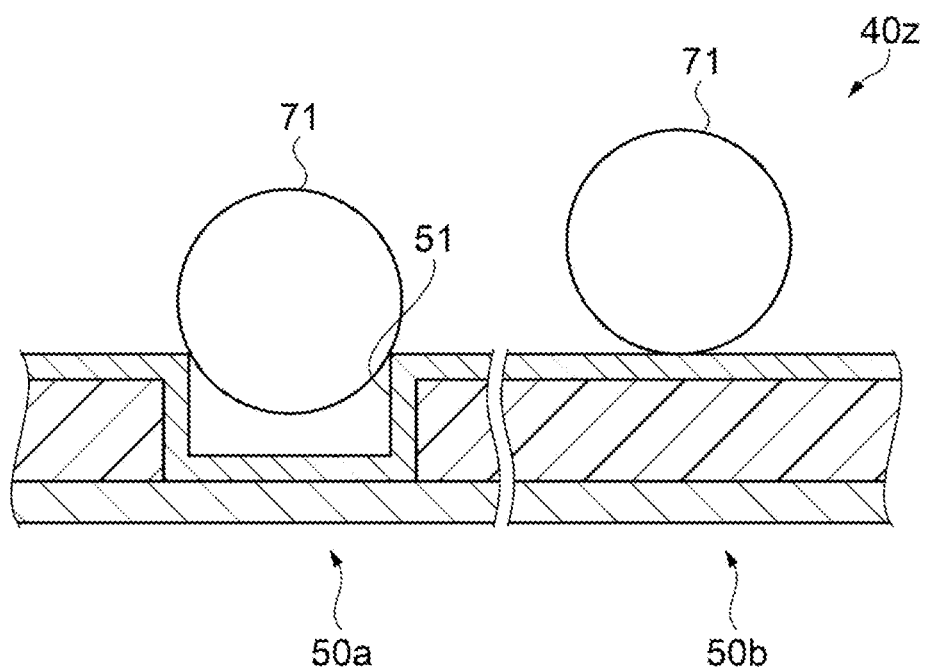
FIG. 26 is a cross-sectional view illustrating the configuration of the known connection terminal portion.

Specifically, the electrically conductive particles 71 in the vicinity of the recessed portions 51 may move and fall into the recessed portions 51 at the time of pressing the electrically conductive particles 71 (see FIG. 26). For example, as illustrated in FIG. 25, in a known terminal portion 40z, a large number of electrically conductive particles 71 may fall into recessed portions 51 in a first connection terminal 50a. FIG. 25 is a plan view illustrating the arrangement relationship between the recessed portions 51 of the first connection terminal 50a and the second connection terminal 50b and the electrically conductive particles 71 of the particle aligned type anisotropic conductive film 70 in the related art. FIG. 26 is a cross-sectional view illustrating the structure of the recessed portion 51 in the first connection terminal 50a, and the structure of the recessed portion 51 in the second connection terminal 50b. Here, FIG. 25 is a view illustrating an extreme example for explicitly describing such a drawback.

Whether or not the recessed portions 51 and the electrically conductive particles 71 agree with each other in coordinates is a matter of probability. For example, in a case where the arrangement pitch of the recessed portions 51 and the arrangement pitch of the electrically conductive particles 71 are 10 μm respectively, a size of each recessed portion 51 is 2 μm, and an average diameter of the electrically conductive particles 71 is 3 μm, the recessed portions 51 and the electrically conductive particles 71 may overlap with each other with the probability of approximately 20% with respect to Y coordinates. With respect to X coordinates, to take into account the number of several hundreds of connection terminals, the extension of the particle aligned type anisotropic conductive film 70 and the like, it should be estimated that the recessed portions 51 and the electrically conductive particles 71 may overlap with each other at some connection terminals. As a result, at some connection terminals in the connection terminal portion 40 of one liquid crystal panel 100, the coordinates of the recessed portions 51 and the coordinates electrically conductive particles 71 may substantially agree with each other with non-ignorable probability.

As illustrated in FIG. 25, when the arrangement direction of the recessed portions 51 and the arrangement direction of the electrically conductive particles 71 are equal to each other and the arrangement pitch of the recessed portions 51 and the arrangement pitch of the electrically conductive particles 71 are equal to each other, it is conceivable that the large number of electrically conductive particles 71 fall into the recessed portions 51 in the first connection terminal 50a. On the other hand, in the second connection terminal 50b, it is also conceivable that most of the electrically conductive particles 71 do not fall into the recessed portions 51.

Such a difference may occur at the plurality of connection terminals 50a and 50b. This is because a state where the recessed portions 51 and the electrically conductive particles 71 agree with each other in position at an interval that is the least common multiple of the arrangement pitch of the recessed portions 51 and the arrangement pitch of the electrically conductive particles 71 may occur. When the printed circuit board 110 is adhered to the connection terminals 50a and 50b by compression bonding, the electrically conductive particles 71 of the first connection terminal 50a are pressed insufficiently thus being minimally collapsed properly, while the electrically conductive particles 71 of the second connection terminal 50b are pressed sufficiently thus being properly and easily collapsed. Accordingly, the first connection terminal 50a is brought into a high electrical resistance state.

In the present embodiment, as illustrated in FIG. 9 and FIG. 10, examples of the electrically conductive particles 71 that are displaced from the arrangement in the first arrangement direction or in the second arrangement direction and fall into the recessed portions 51 when the compression bonding is performed are indicated by a black dot. Further, when the particle aligned type anisotropic conductive film 70 is manufactured, there is a certain amount of arrangement failure of the electrically conductive particles 71, and there exist the electrically conductive particles 71 that are displaced from an original proper arrangement axis and the electrically conductive particles 71 that fall from the connection terminals 50a and 50b at the time of pressing the electrically conductive particles 71 and are eventually displaced from the original proper arrangement axis. Examples of such electrically conductive particles 71 are indicated by dotted hatching. Further, among the electrically conductive particles 71 disposed between the first connection terminal 50a and the second connection terminal 50b, there are some electrically conductive particles 71 that move because of softening of a binder brought about by applying of heat at the time of pressing the electrically conductive particles 71. Examples of such electrically conductive particles 71 are indicated by meshed hatching.

Here, the arrangement direction is a virtual approximate straight line direction that can be drawn by the plurality of electrically conductive particles 71 disposed on the connection terminals 50a and 50b and indicated by oblique-line hatching except for the irregular electrically conductive particles 71. The arrangement direction is not defined by a virtual straight line that can be drawn by the irregular electrically conductive particles 71. Further, as illustrated in FIG. 10, in the second arrangement direction, the widths of the connection terminals 50a and 50b are narrow and the number of electrically conductive particles 71 is insufficient.

Accordingly, the second arrangement direction is assumed as a direction of a virtual approximate straight line that can be drawn by the electrically conductive particles 71 except for the irregular electrically conductive particles 71 described above when the electrically conductive particles 71 are viewed from above across the plurality of connection terminals 50a and 50b.

It is needless to say that if one connection terminal 50a (50b) has a proper number of electrically conductive particles 71, the direction of the virtual approximate straight line that becomes the second arrangement direction may be obtained from the one connection terminal 50a (50b). Such a virtual approximate straight line can be recognized by looking the arrangement of the electrically conductive particles 71 at a dummy terminal provided for observing the degree of collapsing of the electrically conductive particles 71, for example. If there are a plurality of such dummy terminals, an average direction may be obtained from a plurality of virtual approximate straight lines.

In this manner, since the arrangement direction of the electrically conductive particles 71 is inclined so as to be different from the arrangement direction of the recessed portions 51, the large number of electrically conductive particles 71 are prevented from falling into the recessed portions 51 in the contact structure. Further, by setting the inclination angle of the first arrangement direction to the angle θ1, the angle θ2 or more, it is possible to arrange the electrically conductive particles 71 to which the proper pressing is applied. Still further, by setting the inclination angle of the second arrangement direction to the angle θ3, the angle θ4 or more, it is possible to dispose the electrically conductive particles 71 to which the proper pressing is applied. Accordingly, it is possible to avoid forming the connection terminal portions 40a, 40b that have an extremely deteriorated electrical characteristic.

Here, as illustrated in FIG. 10, there may be a case where the column of the electrically conductive particles 71 at the end portion of the connection terminal 50a fall into the column of recessed portions 51. At this time, the width of the external terminals 211a, 211b, that is, a width of a copper foil pattern on the printed circuit board 110 is set such that the external terminals 211a, 211b each include three or more columns of the electrically conductive particles 71. More specifically, assuming the average diameter of the electrically conductive particles 71 as D1, it is sufficient that the widths of the external terminals 211a, 211b be set to satisfy the following formula 5.

"The width of external terminal of the printed circuit board≥(is equal to or larger than) the arrangement pitch of the electrically conductive particles 71 in the X direction×2+D1"     (formula 5).

By setting the width of the external terminal in the printed circuit board 110 to satisfy the above-mentioned conditions, it is possible to ensure at least one column of electrically conductive particles 71 to which proper pressing can be applied. For example, in FIG. 10, although the external terminal 211a is ideally aligned so as to include exactly three rows of electrically conductive particles 71, assuming a case where the external terminal 211a is aligned in a leftwardly displaced manner by an amount of 0.5 column with respect to the column of the electrically conductive particles 71, the external terminal 211a includes two columns of electrically conductive particles 71. In this case, although the electrical connection using only the electrically conductive particles 71 on the left column entails a risk of connection failure because the electrically conductive particles 71 fall into the recessed portions 51, with respect to the electrical connection using the electrically conductive particles 71 in the center column, the second arrangement direction is inclined with respect to the X direction and hence, the electrically conductive particles 71 do not fall into the recessed portions 51 whereby proper pressing can be applied to the electrically conductive particles 71. Accordingly, it is possible to avoid forming the connection terminal portion 40b that has an extremely deteriorated electrical characteristic.

Although not illustrated in the drawings, when the electrically conductive particles 71 in the center column fall into the recessed portions 51, the second arrangement direction is inclined with respect to the X direction and hence, the electrically conductive particles 71 in the left and right columns do not fall into the recessed portions 51. Accordingly, when the external terminal 211a is ideally aligned or is aligned in a leftwardly or rightwardly displaced manner by an amount of 0.5 column, by setting the width of the external terminal in the printed circuit board 110 such that the external terminal includes three or more columns of the electrically conductive particles 71, the proper pressing can be applied to the electrically conductive particles 71 on at least either one of the left and right columns. Accordingly, it is possible to avoid forming the connection terminal portion 40b that has an extremely deteriorated electrical characteristic.

Figure 11:
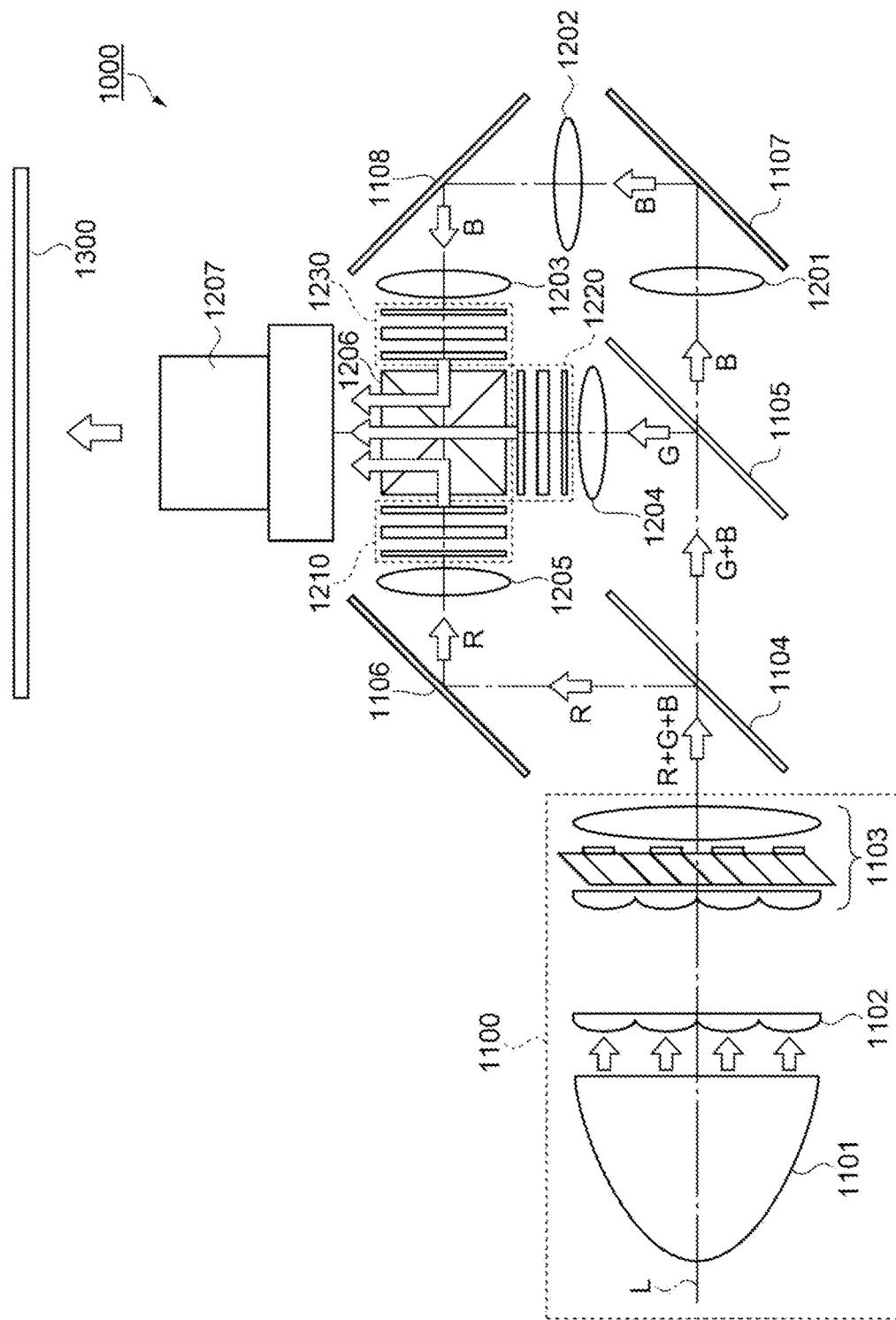
FIG. 11 is a schematic view illustrating a configuration of a projector as an electronic apparatus.

As illustrated in FIG. 11, a projector 1000 as the electronic apparatus of the present embodiment includes a polarized light illumination device 1100 disposed along a system optical axis L, two dichroic mirrors 1104, 1105 as optical separation elements, three reflection mirrors 1106, 1107, and 1108, five relay lenses 1201, 1202, 1203, 1204, and 1205, three transmissive liquid crystal light valves 1210, 1220, and 1230 as three optical modulation units, a cross dichroic prism 1206 as a photosynthesis element, and a projection lens 1207.

The polarized light illumination device 1100 generally includes a lamp unit 1101 being as a light source including a white light source such as an extra-high pressure mercury lamp or a halogen lamp, an integrator lens 1102, and a polarization conversion element 1103.

The dichroic mirror 1104 reflects the red light (R) of a polarized light flux exiting from the polarized light illumination device 1100 and transmits the green light (G) and the blue light (B). The other dichroic mirror 1105 reflects the green light (G) transmitted by the dichroic mirror 1104 and transmits the blue light (B).

The red light (R) reflected by the dichroic mirror 1104 is reflected by the reflection mirror 1106 and is then incident on the liquid crystal light valve 1210 via the relay lens 1205. The green light (G) reflected by the dichroic mirror 1105 is incident on the liquid crystal light valve 1220 via the relay lens 1204. The blue light (B) transmitted by the dichroic mirror 1105 is incident on the liquid crystal light valve 1230 via a light guide system including the three relay lenses 1201, 1202, and 1203 and the two reflection mirrors 1107 and 1108.

The liquid crystal light valves 1210, 1220, and 1230 are each disposed facing an incident surface of each type of color light of the cross dichroic prism 1206. The color light incident on the liquid crystal light valves 1210, 1220, and 1230 is modulated based on video information (video signal) and exits toward the cross dichroic prism 1206.

This prism includes four rectangular prisms bonded together, where on inner surfaces of the prisms, a dielectric multilayer film configured to reflect the red light and a dielectric multilayer film configured to reflect the blue light are formed in a cross shape. The three types of color light are synthesized by these dielectric multilayer films, and light representing a color image is synthesized. The synthesized light is projected onto a screen 1300 by the projection lens 1207 being a projection optical system so that an image is displayed in an enlarged manner.

The liquid crystal light valve 1210 is a valve to which the above-mentioned liquid crystal device 500 is applied. The liquid crystal device 500 is disposed between a pair of light polarizing elements disposed in a crossed-Nicols state at an incident side and an exit side of the color light with a gap. The same applies to the other liquid crystal light valves 1220 and 1230.

As the electronic apparatus on which the liquid crystal device 500 is mounted, besides the projector 1000, various electronic apparatus can be named such as a head-up display (HUD), a head-mounted display (HMD), a smartphone, an electrical view finder (EVF), a mobile mini projector, an electronic book, a mobile phone, a mobile computer, a digital camera, a digital video camera, a display, onboard equipment, audio equipment, an exposure device, and a lighting equipment.

As has been described above, the liquid crystal device 500 of the first embodiment includes the liquid crystal panel 100, the particle aligned type anisotropic conductive film 70 having the electrically conductive particles 71 that are regularly arranged in a predetermined arrangement pattern as viewed in plan view, and the printed circuit board 110 coupled to the connection terminals 50a and 50b of the liquid crystal panel 100 via the particle aligned type anisotropic conductive film 70. The plurality of recessed portions 51 are formed on the surfaces of the connection terminals 50a and 50b, and the arrangement direction of the electrically conductive particles 71 and the arrangement direction of the recessed portions 51 differ from each other.

According to such a configuration, it is possible to suppress the falling of the large number of electrically conductive particles 71 into the recessed portions 51. Accordingly, when the printed circuit board 110 is adhered to the connection terminal portions 40a, 40b via the particle aligned type anisotropic conductive film 70 by compression bonding, the electrically conductive particles 71 to which the proper pressing is applied are arranged on the connection terminals 50a and 50b and hence, it is possible to suppress the lowering of the electrical connection performance of the connection terminal portions 40a, 40b. As a result, it is possible to provide a high-definition and miniaturized liquid crystal device 500.

The electrically conductive particles 71 are arranged in the first arrangement direction intersecting with the long sides 50L of the connection terminals 50a and 50b and hence, when the recessed portions 51 are arranged along the long sides 50L of the connection terminals 50a and 50b, the arrangement direction of the electrically conductive particles 71 and the arrangement direction of the recessed portions 51 are different from each other. Accordingly, it is possible to suppress the falling of the electrically conductive particles 71 into the recessed portions 51.

Further, it is preferable that, assuming a length of an arrangement region for the recessed portions 51 in each of the connection terminals 50a and 50b as L, and a width of each recessed portion 51 as D2, the angle θ1 made by an intersection of the direction that the recessed portions 51 are arranged along the long sides 50L of the connection terminals 50a and 50b and the direction that the electrically conductive particles 71 are arranged in the first arrangement direction be set to satisfy the following formula 1.

$$\text{Tan } \theta 1 \geq 0.5 \times D2/L \qquad \text{(formula 1)}$$

According to such a configuration, by arranging the recessed portions 51 and the electrically conductive particles 71 so as to satisfy the above-mentioned condition, it is possible to prevent at least one conductive particle 71 from falling into the recessed portion 51 in a certain column of the electrically conductive particles 71 and hence, proper pressing can be applied to the electrically conductive particle 71. Accordingly, the connection terminals 50a and 50b and the printed circuit board 110 can be electrically coupled to each other. Here, it is more preferable that the angle θ1 be set to satisfy the relationship Tan θ1≥D2/L by taking into account an actual coordinate deviation.

Further, it is preferable that, assuming the length of the arrangement regions for the recessed portions 51 in the connection terminals 50a and 50b as L, the average diameter of the electrically conductive particles 71 as D1, and the width of each recessed portion 51 as D2, the angle θ2 made by an intersection of the direction that the recessed portions 51 are arranged along the long sides 50L of the connection terminals 50a and 50b and the direction that the electrically conductive particles 71 are arranged in the first arrangement direction be set to satisfy the following formula 2.

$$\text{Tan } \theta 2 \geq 0.5 \times (D1+D2)/L \qquad \text{(formula 2)}$$

According to such a configuration, by arranging the recessed portions 51 and the electrically conductive particles 71 so as to satisfy the above-mentioned condition, it is possible to prevent the plurality of electrically conductive particles 71 from falling into the recessed portions 51 in a certain column of the electrically conductive particles 71 and hence, proper pressing can be applied to the electrically conductive particles 71. Accordingly, the connection terminals 50a and 50b and the printed circuit board 110 can be electrically coupled to each other in a more stable manner.

The electrically conductive particles 71 are arranged in the second arrangement direction intersecting with the short sides 50S of the connection terminals 50a and 50b and hence, when the recessed portions 51 are arranged along the short sides 50S of the connection terminals 50a and 50b, the arrangement direction of the electrically conductive particles 71 and the arrangement direction of the recessed portions 51 are different from each other. Accordingly, it is possible to suppress the falling of a large number of electrically conductive particles 71 into the recessed portions 51.

Further, it is preferable that, assuming the width of the arrangement regions for the recessed portions 51 in the connection terminals 50a and 50b as W, and the width of each recessed portion 51 as D2, the angle θ3 made by intersection of the direction that the recessed portions 51 are arranged along the short sides 50S of the connection terminals 50a and 50b and the direction that the electrically conductive particles 71 are arranged in the second arrangement direction be set to satisfy the following formula 3.

$$\text{Tan } \theta 3 \geq 0.5 \times D2/W \qquad \text{(formula 3)}$$

According to such a configuration, by arranging the recessed portions 51 and the electrically conductive particles 71 so as to satisfy the above-mentioned condition, it is possible to prevent at least one conductive particle 71 from falling into the recessed portion 51 in a certain column of the electrically conductive particles 71 and hence, proper pressing can be applied to the electrically conductive particle 71. Accordingly, the connection terminals 50a and 50b and the printed circuit board 110 can be electrically coupled to each other. Here, it is more preferable that the angle θ3 be set to satisfy the relationship Tan θ3≥D2/W by taking into account an actual coordinate deviation.

Further, it is preferable that, assuming the width of the arrangement regions for the recessed portions 51 in the connection terminals 50a and 50b as W, the average diameter of the electrically conductive particles 71 as D1, and the width of each recessed portion 51 as D2, the angle θ4 made by intersection of the direction that the recessed portions 51 are arranged along the short sides 50S of the connection terminals 50a and 50b and the direction that the electrically conductive particles 71 are arranged in the second arrangement direction be set to satisfy the following formula 4.

$$\text{Tan } \theta 4 \geq 0.5 \times (D1+D2)/W \qquad \text{(formula 4)}$$

According to such a configuration, by arranging the recessed portions 51 and the electrically conductive particles 71 so as to satisfy the above-mentioned condition, it is possible to prevent the plurality of electrically conductive particles 71 from falling into the recessed portions 51 in a certain row of the electrically conductive particles 71 and hence, proper pressing can be applied to the electrically conductive particles 71. Accordingly, the connection terminals 50a and 50b and the printed circuit board 110 can be electrically coupled to each other in a more stable manner.

When the electrically conductive particles 71 are arranged in the second arrangement direction intersecting with the short sides 50S of the connection terminals 50a and 50b, with respect to the width of the external terminal of the printed circuit board 110, assuming an average diameter of the electrically conductive particles 71 as D1, it is preferable that the width of the external terminal of the printed circuit board 110 be set to satisfy the following formula 5.

"The width of the external terminal of the printed circuit board≥(is equal to or larger than) the arrangement pitch of the electrically conductive particles 71 in the X direction×2+D1"  (formula 5).

According to such a configuration, by setting the widths of the external terminals 211a, 211b of the printed circuit board 110 so as to satisfy the above-mentioned conditions, even when the external terminals 211a, 211b have the alignment deviation in the X direction with respect to the connection terminals 50a and 50b, it is possible to prevent the plurality of electrically conductive particles 71 from falling into the recessed portions 51 and hence, proper pressing can be applied to the electrically conductive particles 71. Accordingly, the connection terminals 50a and 50b and the printed circuit board 110 can be electrically coupled to each other in a more stable manner.

By providing the liquid crystal device 500 described above, it is possible to provide the projector 1000 capable of making the supply of signals and voltages stable and improving display quality.

Second Embodiment

Figure 12:
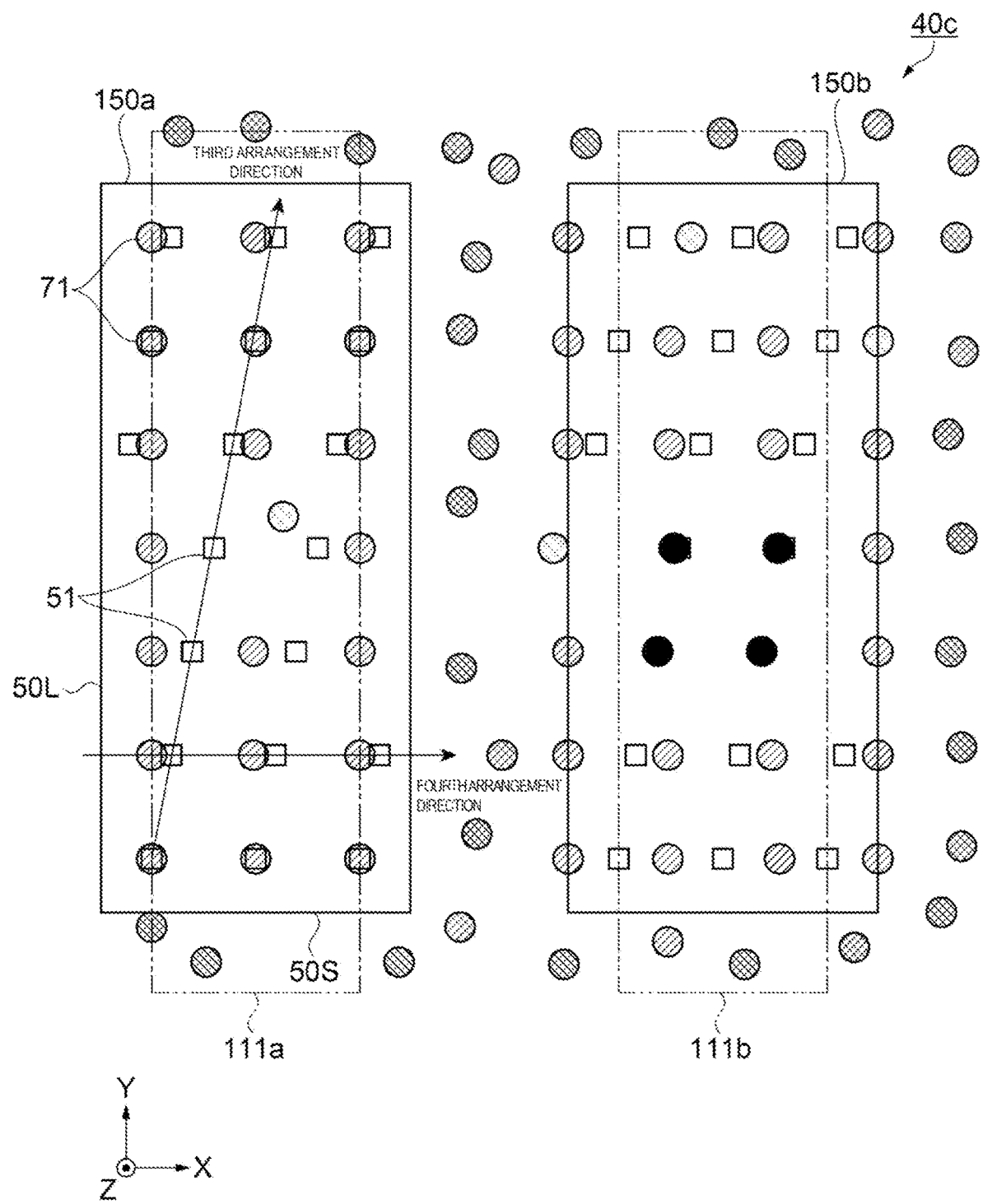
FIG. 12 is a plan view illustrating a configuration of a connection terminal portion according to a second embodiment.

As illustrated in FIG. 12, a connection terminal portion 40c according to a second embodiment is formed such that a plurality of recessed portions 51 are arranged in a lattice shape and in a state of being uniformly aligned along the third arrangement direction and the fourth arrangement direction. Out of the arrangement directions of the recessed portions 51, the third arrangement direction is inclined with respect to an extending direction of long sides 50L of connection terminals 150a and 150b, and the fourth arrangement direction is aligned with the X direction that is equal to an extending direction of short sides 50S of the connection terminals 150a, 150b. Further, as viewed in plan view, electrically conductive particles 71 of a particle aligned type anisotropic conductive film 70 are arranged in a lattice shape and at equal intervals in the X direction and the Y direction. As described above, a state where the plurality of electrically conductive particles 71 are arranged in a lattice shape and at equal intervals along the X direction and the Y direction can be paraphrased as a state where the plurality of electrically conductive particles 71 are arranged in a state of being aligned.

In this manner, the second embodiment differs from the first embodiment in that, in the connection terminal portion 40c, the arrangement direction of the recessed portions 51 is inclined with respect to the extending direction of the long side 50L of the first connection terminal 150a, and the arrangement direction of the electrically conductive particles 71 is not inclined with respect to the sides of the connection terminals 150a and 150b. Other configurations of the second embodiment are substantially equal to the corresponding configurations of the first embodiment. Accordingly, in the second embodiment, parts that make the second embodiment different from the first embodiment are described in detail, and the descriptions of other parts identical with the corresponding parts in the first embodiment are omitted when appropriate.

As illustrated in FIG. 12, the electrically conductive particles 71 of the second embodiment are regularly arranged in parallel to the long side 50L of the first connection terminal 150a and in a predetermined arrangement pattern. Further, the electrically conductive particles 71 are arranged in a matrix array at predetermined intervals. On the other hand, the recessed portions 51 of the connection structure are arranged along the third arrangement direction intersecting with the long side 50L of the first connection terminal 150a.

Specifically, in the first connection terminal 150a, a length of the long side 50L extending along the Y direction is 500 μm, for example, and a length of the short side 50S extending along the X direction is 30 μm, for example. The arrangement pitch of the electrically conductive particles 71 is 10 μm, for example. For example, the recessed portions 51 are arranged in an offset manner by 2 μm in the X direction per every row of the recessed portions 51 in the first arrangement direction.

FIG. 12 is a view illustrating a state of the connection terminal portion 40c after the printed circuit board 110 is adhered to the connection terminal portion 40c by compression bonding via the particle aligned type anisotropic conductive film 70. As described above, the electrically conductive particles 71 that fall into the recessed portions 51 are indicated by a black dot. Further, when the particle aligned type anisotropic conductive film 70 is manufactured, there is a certain amount of arrangement failure of the electrically conductive particles 71 where there exist the electrically conductive particles 71 that are displaced from an original proper arrangement axis and the electrically conductive particles 71 that fall from the connection terminals 150a and 150b at the time of pressing the electrically conductive particles 71 and are eventually displaced from the original proper arrangement axis. Examples of such electrically conductive particles 71 are indicated by dotted hatching. Further, among the electrically conductive particles 71 disposed between the first connection terminal 150a and the second connection terminal 150b, there are some electrically conductive particles 71 which move because of softening of a binder brought about by applying of heat at the time of pressing the electrically conductive particles 71. Examples of such electrically conductive particles 71 are indicated by meshed hatching.

By arranging the electrically conductive particles 71 and the recessed portions 51 in this manner, four fifths of the entire electrically conductive particles 71 are prevented from falling into the recessed portions 51. That is, while the arrangement pitch of the electrically conductive particles 71 is 10 μm, the recessed portions 51 are arranged in an offset manner by 2 μm in the X direction per every row of the recessed portions 51 in the first arrangement direction and hence, for example, when the electrically conductive particle 71 falls into the recessed portion 51 in the left column of the first row out of the recessed portions 51 on the first connection terminal 150a, the electrically conductive particle 71 that may next fall into the recessed portion 51 in the same manner is the electrically conductive particles 71 in the sixth row. Accordingly, the four fifth of the entire electrically conductive particles 71 are prevented from falling into the recessed portions 51.

As described above, the recessed portions 51 of the connection terminal portion 40c according to the second embodiment are arranged in the third arrangement direction intersecting with the long sides 50L of the connection terminals 150a and 150b.

With such a configuration, the recessed portions 51 are arranged in the first arrangement direction intersecting with the long sides 50L of the connection terminals 150a, 150b and hence, when the electrically conductive particles 71 are arranged along the long sides 50L of the connection terminals 150a and 150b, the arrangement direction of the recessed portions 51 and the arrangement direction of the electrically conductive particles 71 are different from each other. Accordingly, it is possible to suppress the falling of a large number of electrically conductive particles 71 into the recessed portions 51.

Third Embodiment

Figure 13:
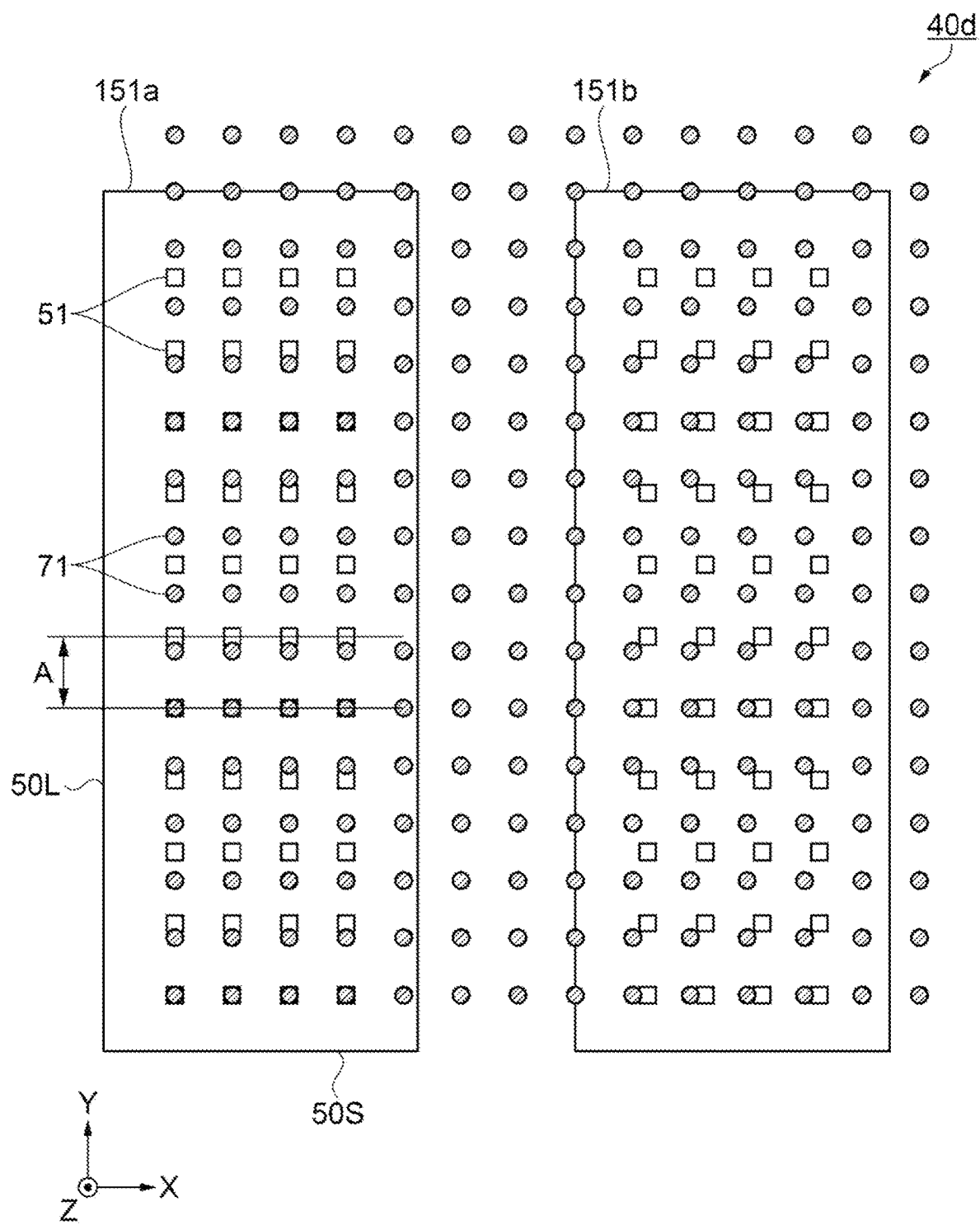
FIG. 13 is a plan view illustrating a configuration of a connection terminal portion according to a third embodiment.
Figure 14:
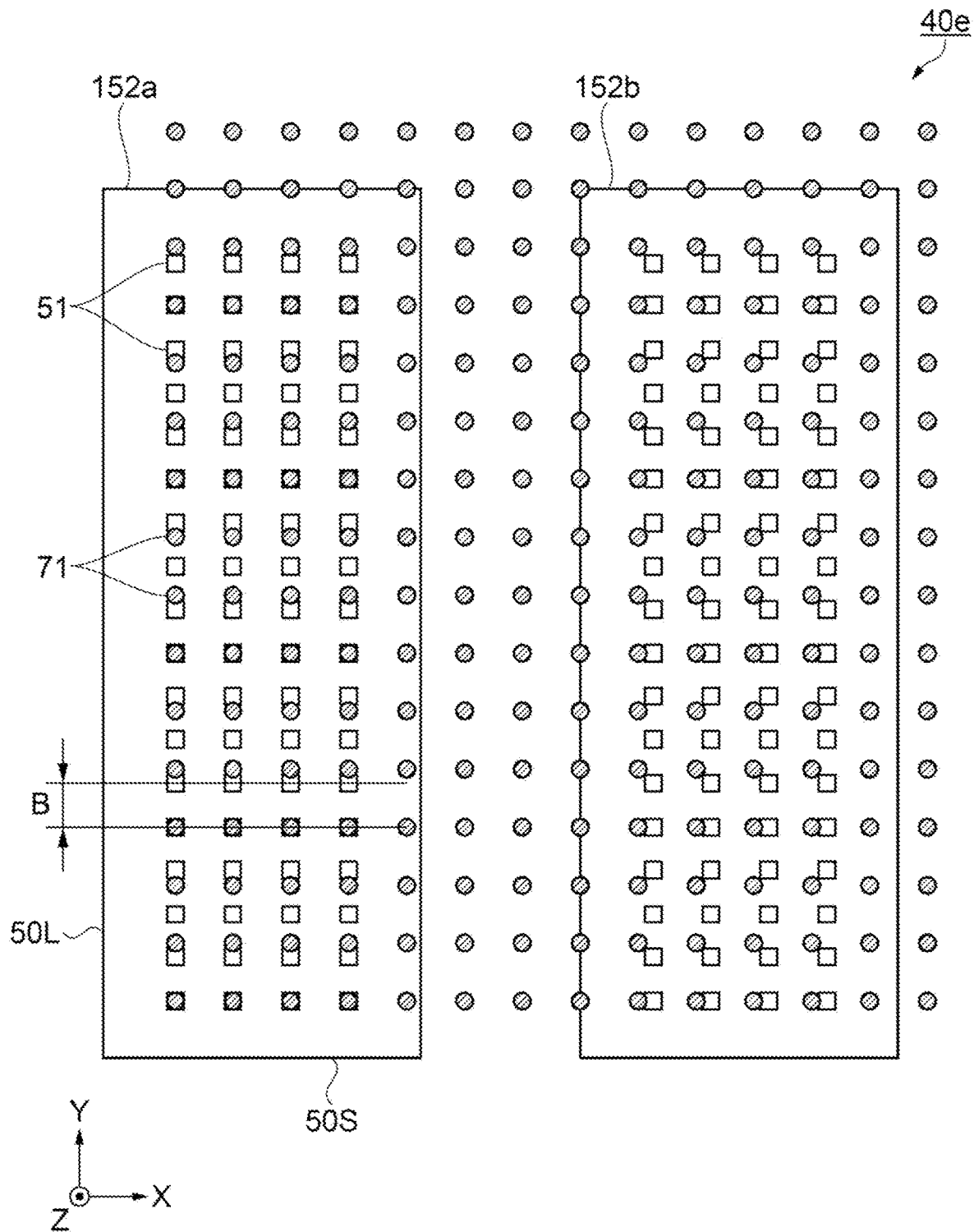
FIG. 14 is a plan view illustrating a configuration of a connection terminal portion according to another mode of the third embodiment.

FIG. 13 and FIG. 14 are views illustrating configurations of connection terminal portions 40d and 40e according to a third embodiment. In the third embodiment, electrically conductive particles 71 of a particle aligned type anisotropic conductive film 70 are arranged in a lattice shape and in a state of being uniformly aligned along the X direction and the Y direction as viewed in plan view. Further, recessed portions 51 of connection terminals 151a, 151b, 152a, and 152b are also arranged in a lattice shape and in a state of being uniformly aligned along the X direction and the Y direction as viewed in plan view.

In the third embodiment, an arrangement pitch of the electrically conductive particles 71 and an arrangement pitch of the recessed portions 51 are different from each other. Specifically, in the Y direction, the arrangement pitch of the recessed portions 51 of the connection terminals 151a, 151b, 152a, and 152b along the Y direction is larger than the arrangement pitch of the electrically conductive particles 71 of the particle aligned type anisotropic conductive film 70 along the Y direction (see FIG. 13) or smaller than the arrangement pitch of the electrically conductive particles 71 along the Y direction (see FIG. 14). Other configurations of the third embodiment are substantially equal to the corresponding configurations of the first embodiment. Accordingly, in the third embodiment, parts that make the third embodiment different from the first embodiment are described in detail, and the descriptions of other parts identical with the corresponding parts in the first embodiment are omitted when appropriate.

As illustrated in FIG. 13, the electrically conductive particles 71 of the connection terminal portion 40d according to the third embodiment are arranged in a matrix array so as to keep a predetermined interval between the electrically conductive particles 71 adjacent to each other. On the other hand, the recessed portions 51 are arranged in a direction along a long side 50L of the first connection terminal 151a at a first arrangement pitch A that is larger than the arrangement pitch of the electrically conductive particles 71.

For example, assume that the arrangement pitch of the electrically conductive particles 71 is 10 μm, and the arrangement pitch of the recessed portions 51 is 50χ4 μm. In this case, the electrically conductive particles 71 may overlap with the recessed portions 51 at every five other electrically conductive particles 71. In other words, out of five electrically conductive particles 71, four electrically conductive particles 71 do not fall into the recessed portions 51.

In this manner, by setting the arrangement pitch of the recessed portions 51 in the direction of the long side 50L of the first connection terminal 151a larger than the arrangement pitch of the electrically conductive particles 71, according to the present embodiment, in each column of the electrically conductive particles 71, approximately 80% of electrically conductive particles 71 can be prevented from falling into the recessed portions 51. Accordingly, it is possible to prevent the large number of electrically conductive particles 71 from falling into the recessed portions 51 and hence, proper pressing can be applied to the large number of electrically conductive particles 71. That is, it is possible to avoid forming the connection terminal portion 40d that has an extremely deteriorated electrical characteristic.

Further, "setting the arrangement pitch of the recessed portions 51 larger than the arrangement pitch of the electrically conductive particles 71" means that the number of recessed portions 51 per unit area is set smaller than the number of electrically conductive particles 71 per unit area in the connection terminal 151a (151b). Accordingly, since there are electrically conductive particles 71 that do not fall into the recessed portions 51, proper pressing can be applied to such electrically conductive particles 71.

As illustrated in FIG. 14, in the same manner as the arrangement of the electrically conductive particles 71 illustrated in FIG. 13, the electrically conductive particles 71 of the connection terminal portion 40e according to the third embodiment are arranged in a matrix array so as to keep a predetermined interval between the electrically conductive particles 71 adjacent to each other. On the other hand, the recessed portions 51 are arranged in the direction (Y direction) along the long side 50L of the first connection terminal 152a at a second arrangement pitch B that is smaller than the arrangement pitch of the electrically conductive particles 71.

For example, assume that the arrangement pitch of the electrically conductive particles 71 is 10 μm, and the arrangement pitch of the recessed portions 51 is 40χ5 μm. In this case, the electrically conductive particles 71 may overlap with the recessed portions 51 at every four other electrically conductive particles 71. In other words, out of four electrically conductive particles 71, three electrically conductive particles 71 do not fall into the recessed portions 51.

In this manner, by setting the arrangement pitch of the recessed portions 51 in the direction of the long side 50L of the first connection terminal 152a smaller than the arrangement pitch of the electrically conductive particles 71, in the present embodiment, approximately 70% of electrically conductive particles 71 can be prevented from falling into the recessed portions 51 in each column of the electrically conductive particles 71. Accordingly, it is possible to prevent the large number of electrically conductive particles 71 from falling into the recessed portions 51 and hence, proper pressing can be applied to the large number of electrically conductive particles 71. That is, it is possible to avoid forming the connection terminal portion 40e that has an extremely deteriorated electrical characteristic.

In this embodiment, as described above, the recessed portions 51 are arranged at the first arrangement pitch A that is larger than the arrangement pitch of the electrically conductive particles 71 or are arranged at the second arrangement pitch B that is smaller than the arrangement pitch of the electrically conductive particles 71 in the Y direction. However, the present disclosure is not limited to such configurations, and the recessed portions 51 may be arranged at the first arrangement pitch A that is larger than the arrangement pitch of the electrically conductive particles 71 or may be arranged at the second arrangement pitch B that is smaller than the arrangement pitch of the electrically conductive particles 71 in the X direction.

As described above, the recessed portions 51 of the connection terminal portions 40d, 40e according to the third embodiment are preferably arranged so as to include at least one of an arrangement that the recessed portions 51 are arranged at the first arrangement pitch A that is larger than the arrangement pitch of the electrically conductive particles 71 and an arrangement that the recessed portions 51 are arranged in the second arrangement pitch B that is smaller than the arrangement pitch of the electrically conductive particles 71.

According to such a configuration, the arrangement pitch of the recessed portions 51 and the arrangement pitch of the electrically conductive particles 71 are different from each other and hence, it is possible to suppress the falling of the large number of electrically conductive particles 71 into the recessed portions 51.

Modification Example

The mode for carrying out the present disclosure is not limited to the configurations of the first to third embodiments described above, and may also be configured as follows. FIG. 15 to FIG. 24 are plan views illustrating configurations of terminal portions 40f, 40g, 40h, 40i, 40j, 40k, 40l, 40m, 40n, and 40p of modification examples.

First Modified Example

Figure 15:
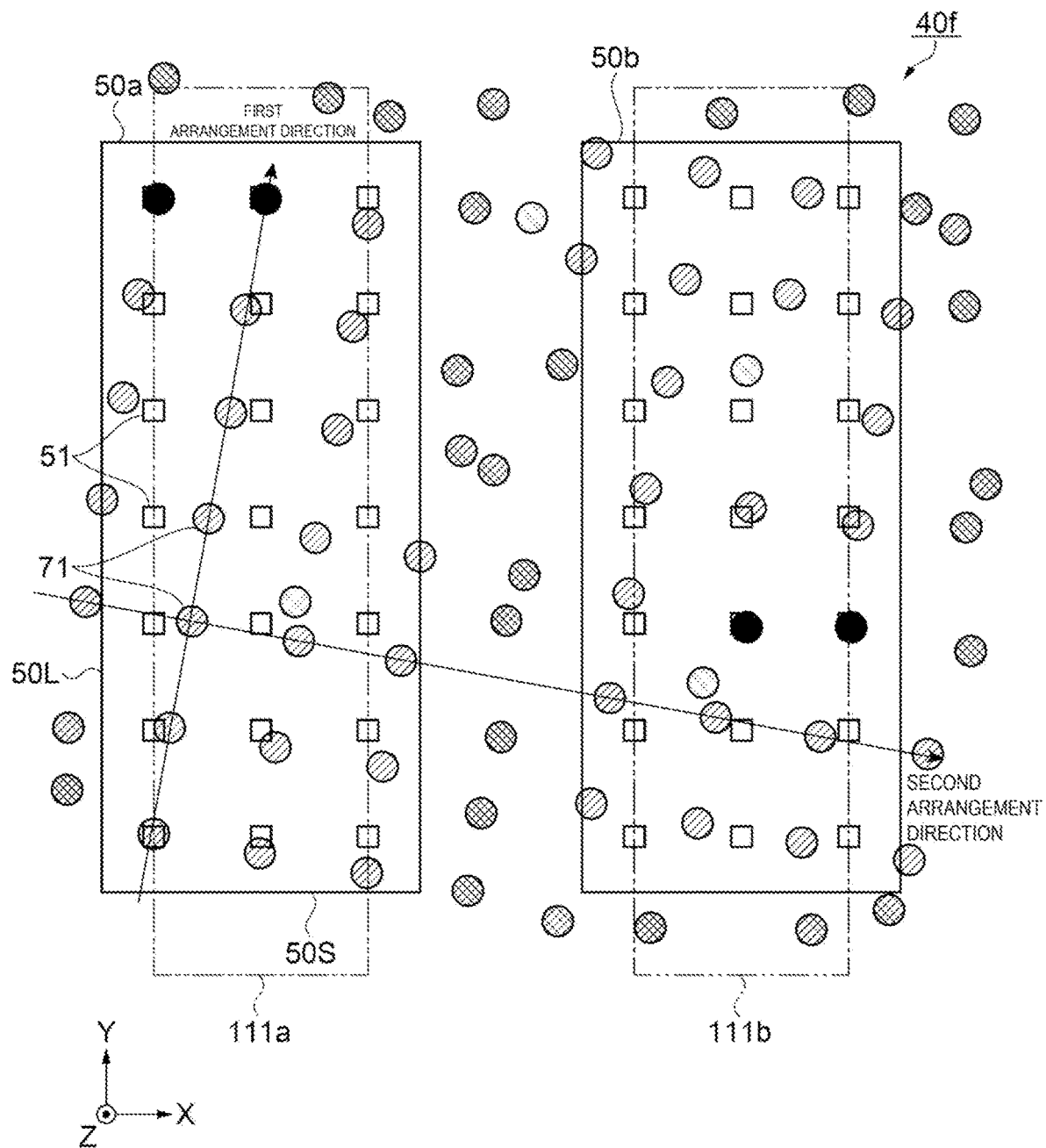
FIG. 15 is a plan view illustrating a configuration of a connection terminal portion according to a first modification example.

In a first modification example illustrated in FIG. 15, electrically conductive particles 71 of a particle aligned type anisotropic conductive film 70 are arranged in a lattice shape and in a state of being uniformly aligned along a first arrangement direction and a second arrangement direction as viewed in plan view. In FIG. 15, the first arrangement direction and the second arrangement direction are inclined with respect to an extending direction (Y direction) of long sides 50L of connection terminals 50a and 50b and an extending direction (X direction) of short sides 50S of the connection terminals 50a and 50b respectively. In FIG. 15, recessed portions 51 of the connection terminals 50a and 50b are arranged in a lattice shape and in a state of being uniformly aligned along the X direction and the Y direction as viewed in plan view.

Specifically, as illustrated in FIG. 15, a terminal portion 40f of the modification example is formed such that the arrangement of the electrically conductive particles 71 includes both the arrangement in the first arrangement direction that intersects with the long side 50L of the first connection terminal 50a and the arrangement in the second arrangement direction that intersects with the short side 50S of the first connection terminal 50a. FIG. 15 illustrates a state of the first connection terminal 50a, the second connection terminal 50b, the electrically conductive particles 71, and external terminals 111a and 111b of a printed circuit board 110 in the terminal portion 40f of the modification example after the printed circuit board 110 is adhered to the terminal portion 40f by compression bonding via the particle aligned type anisotropic conductive film 70. According to the first embodiment, it is preferable that an inclination angle of the first arrangement direction be set to equal to or more than an angle θ2 and an inclination angle of the second arrangement direction be set to equal to or more than an angle θ4.

Second Modified Example

Figure 16:
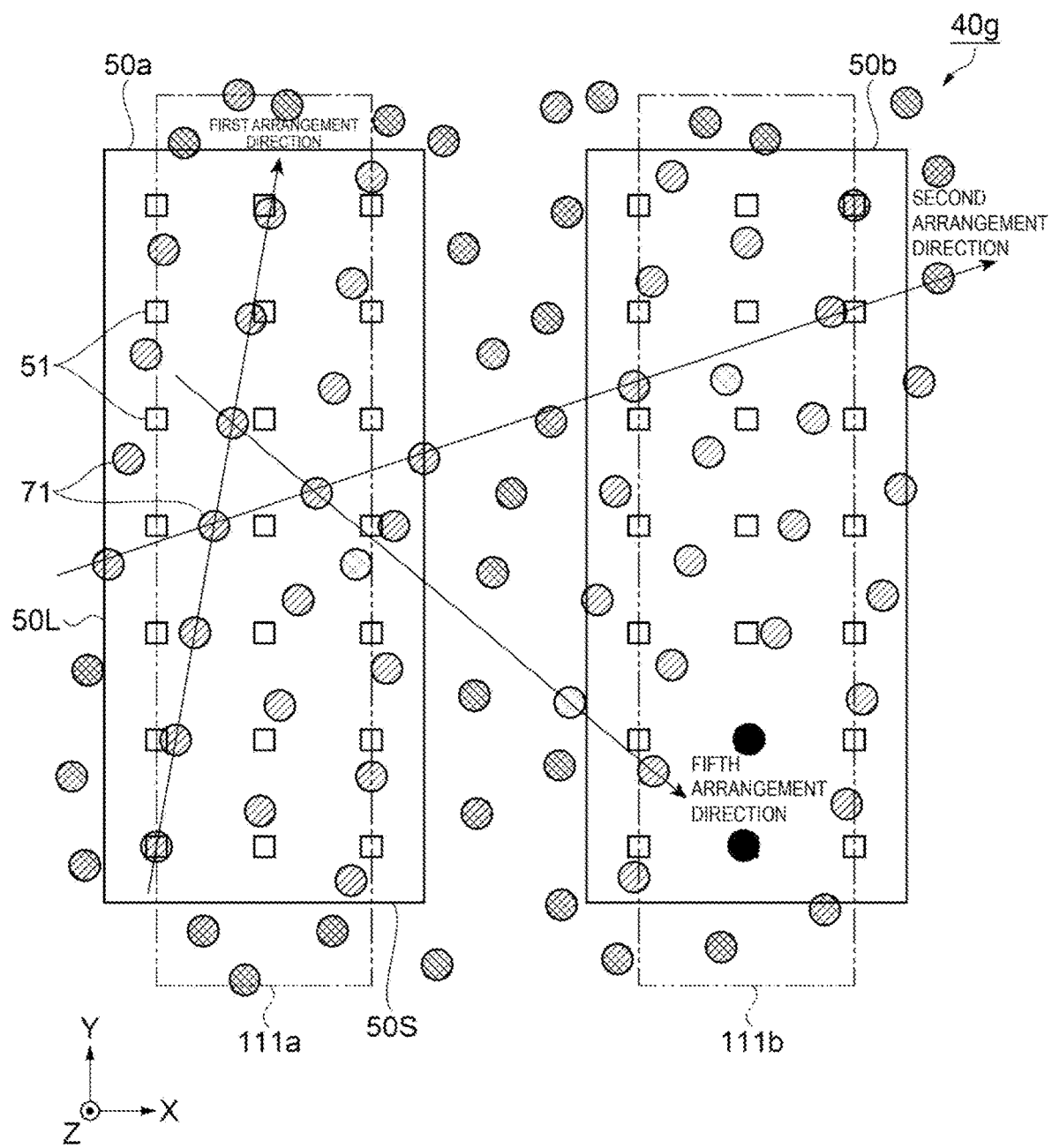
FIG. 16 is a plan view illustrating a configuration of a connection terminal portion according to a second modification example.

In a second modification example illustrated in FIG. 16, electrically conductive particles 71 of a particle aligned type anisotropic conductive film 70 are arranged along a first arrangement direction, a second arrangement direction, and a fifth arrangement direction that intersects with the first arrangement direction and the second arrangement direction in a state of being aligned at positions where the respective arrangement directions intersect with each other as viewed in plan view. In FIG. 16, the first arrangement direction and the second arrangement direction are respectively inclined with respect to an extending direction (Y direction) of long sides 50L of connection terminals 50a and 50b and an extending direction (X direction) of short sides 50S of the connection terminals 50a and 50b in the same manner as the configuration illustrated in FIG. 15.

As illustrated in FIG. 16, recessed portions 51 of the connection terminals 50a and 50b are arranged in a lattice shape and in a state of being uniformly aligned along the X direction and the Y direction as viewed in plan view. FIG. 16 illustrates a state of the first connection terminal 50a, the second connection terminal 50b, the electrically conductive particles 71, and external terminals 111a, 111b of a printed circuit board 110 in a terminal portion 40g of the second modification example after the printed circuit board 110 is adhered to the terminal portion 40g by compression bonding via the particle aligned type anisotropic conductive film 70.

According to the terminal portion 40g of the second modification example, the electrically conductive particles 71 are arranged so as to form a hexagonal shape. For example, when the electrically conductive particles 71 are arranged so as to form a regular hexagonal shape, the first arrangement direction, the second alignment direction, and the fifth alignment direction differ from each other by 60 degrees. Here, with respect to the first arrangement direction, the second arrangement direction, and the fifth arrangement direction, it is sufficient that at least one of the arrangement directions satisfies the inclination condition in the above-mentioned first embodiment.

In the terminal portion 40g of the second modification example, the electrically conductive particles 71 are arranged in the first arrangement direction, the second arrangement direction, and the third arrangement direction that intersect with the long sides 50L and the short sides 50S of the connection terminals 50a and 50b and hence, when the recessed portions 51 are arranged along the long sides 50L and the short sides 50S of the connection terminals 50a and 50b, the arrangement direction of the electrically conductive particles 71 and the arrangement direction of the recessed portions 51 are different from each other. Accordingly, it is possible to suppress the falling of a large number of electrically conductive particles 71 into the recessed portions 51.

Third Modified Example

Figure 17:
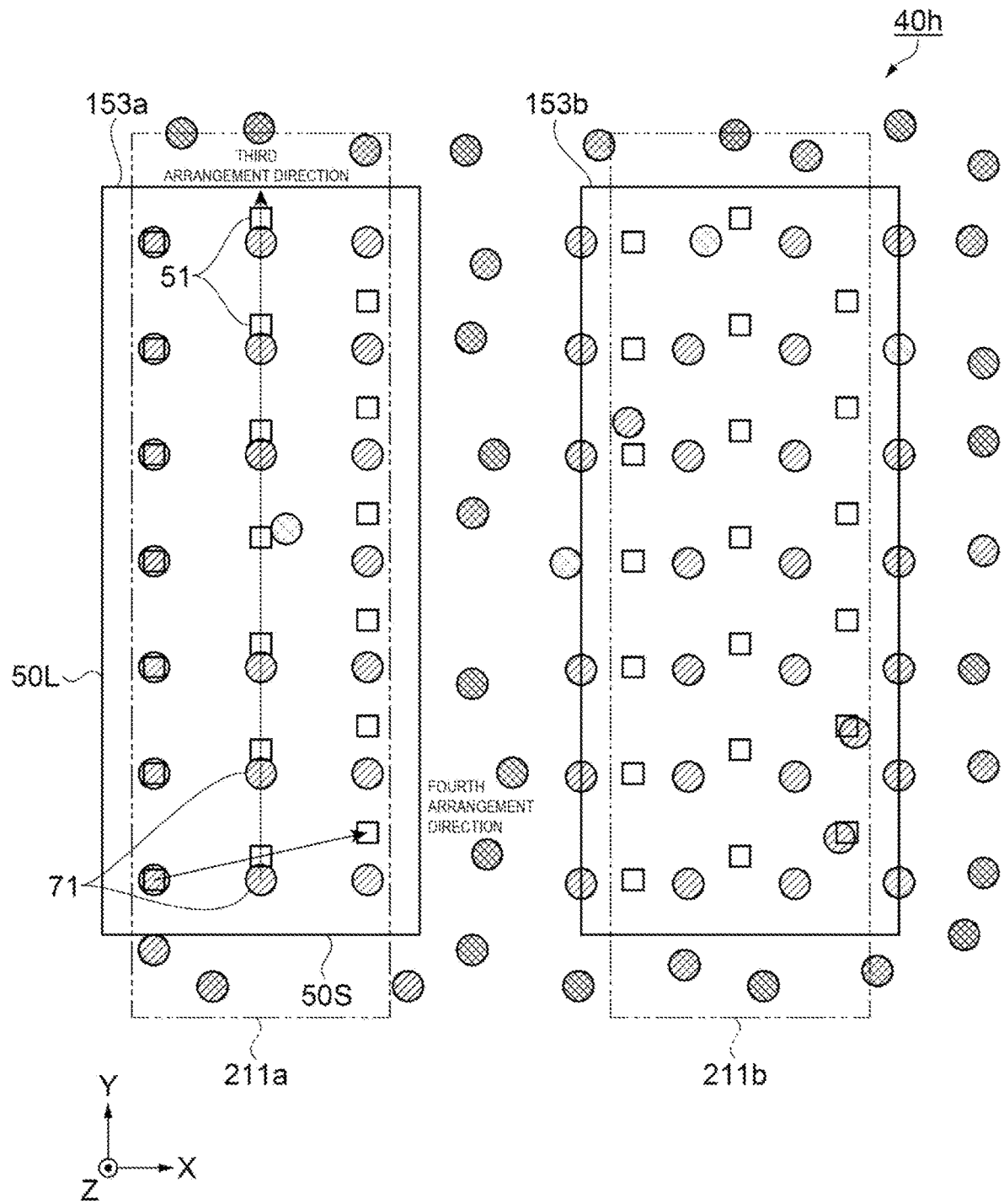
FIG. 17 is a plan view illustrating a configuration of a connection terminal portion according to a third modification example.

In a third modification example illustrated in FIG. 17, electrically conductive particles 71 of a particle aligned type anisotropic conductive film 70 are arranged in a lattice shape and in a state of being uniformly aligned along the X direction and the Y direction as viewed in plan view. In FIG. 17, recessed portions 51 of connection terminals 153a and 153b are arranged in a lattice shape and in a state of being uniformly aligned along a third alignment direction and a fourth arrangement direction as viewed in plan view. Here, the third arrangement direction is the same direction as the Y direction, and the fourth arrangement direction is a direction that intersects with short sides 50S of the connection terminals 153a and 153b.

Specifically, the recessed portions 51 are arranged in an offset manner by 2 μm in the Y direction per every column of the recessed portions 51 in the fourth arrangement direction. FIG. 17 illustrates a state of the first connection terminal 153a, the second connection terminal 153b, the electrically conductive particles 71, and external terminals 211a, 211b of a printed circuit board 110 in a connection terminal portion 40h of the modification example after the printed circuit board 110 is adhered to the connection terminal portion 40h by compression bonding via the particle aligned type anisotropic conductive film 70.

With such a configuration, with respect to two columns of the recessed portions 51 adjacent to each other, the electrically conductive particles 71 are prevented from falling into the recessed portions 51 in either one of two columns. Accordingly, it is preferable that a width of a copper foil pattern that forms the external terminals 211a, 211b of the printed circuit board 110 be set to include three columns of the electrically conductive particles 71.

Further, the arrangement direction of the recessed portions 51 is changed and hence, the probability that the electrically conductive particles 71 fall into the recessed portions 51 can be reduced corresponding to the various arrangement directions of the electrically conductive particles 71 of the particle aligned type anisotropic conductive film 70. Accordingly, options in selecting a manufacturer of the particle aligned type anisotropic conductive films 70 to be used can be increased. The first arrangement direction of the recessed portions 51 in the connection terminal portion 40c according to the second embodiment and the second arrangement direction of the recessed portions 51 in the connection terminal portion 40h according to the modification example may be used in combination.

As described above, the recessed portions 51 of the connection terminal portion 40h of the third modification example are arranged in the fourth arrangement direction intersecting with the short sides 50S of the connection terminals 153a, 153b and hence, when the electrically conductive particles 71 are arranged along the short sides 50S of the connection terminals 153a and 153b, the arrangement direction of the recessed portions 51 and the arrangement direction of the electrically conductive particles 71 are different from each other. Accordingly, it is possible to suppress the falling of the electrically conductive particles 71 into the recessed portions 51.

Further, in the connection terminal portions 40d, 40e according to the third embodiment, with respect to the arrangement pitch of the recessed portions 51 of the first connection terminal 151a, the recessed portions 51 are arranged at the first arrangement pitch A that is larger than the arrangement pitch of the electrically conductive particles 71 of the particle aligned type anisotropic conductive film 70 or are arranged at the second arrangement pitch B that is smaller than the arrangement pitch of the electrically conductive particles 71 in the Y direction. However, the arrangement of the recessed portions 51 is not limited to such a configuration, and the recessed portions 51 may be arranged as illustrated in FIG. 18 and FIG. 19.

Fourth Modification Example

Figure 18:
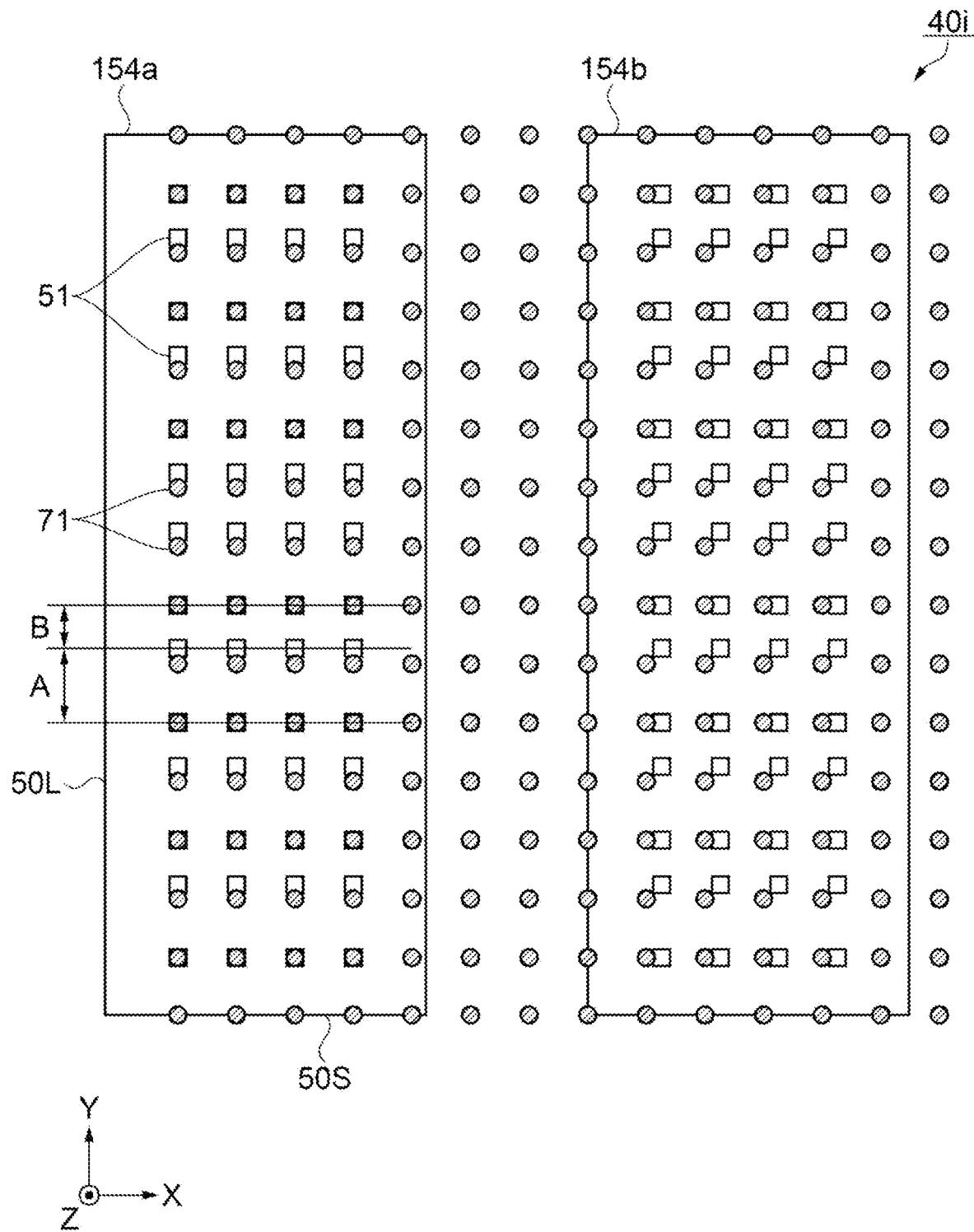
FIG. 18 is a plan view illustrating a configuration of a connection terminal portion according to a fourth modification example.
Figure 19:
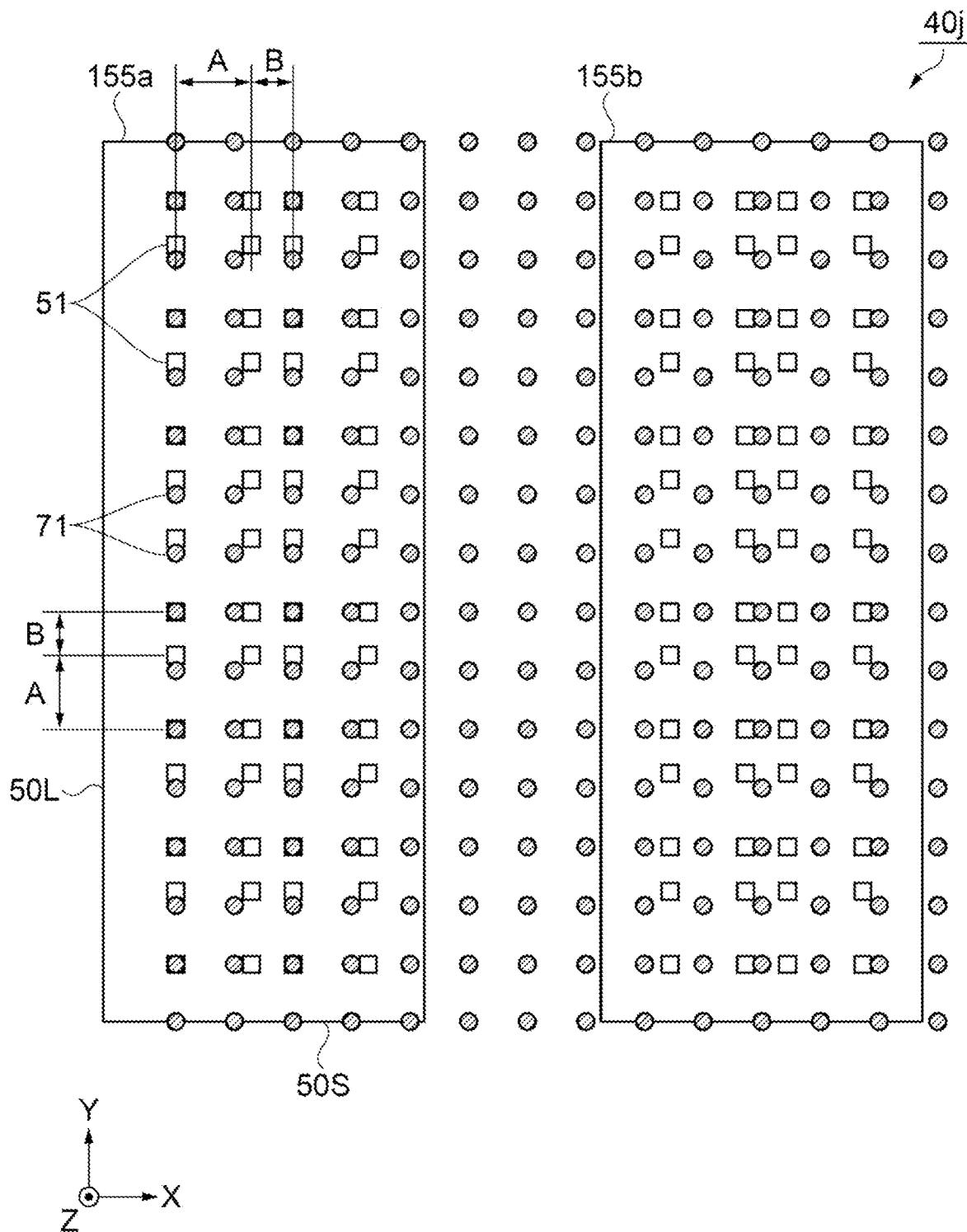
FIG. 19 is a plan view illustrating a configuration of a connection terminal portion according to another mode of the fourth modification example.

In the fourth modification example illustrated in FIG. 18, recessed portions 51 are arranged such that an arrangement where the recessed portions 51 are arranged at a first arrangement pitch A that is larger than an arrangement pitch of electrically conductive particles 71 and an arrangement where the recessed portions 51 are arranged at a second arrangement pitch B that is smaller than the arrangement pitch of the electrically conductive particles 71 are repeated in the Y direction. In the fourth modification example illustrated in FIG. 19, the recessed portions 51 are arranged such that an arrangement where the recessed portions 51 are arranged at the first arrangement pitch A that is larger than the arrangement pitch of the electrically conductive particles 71 and an arrangement where the recessed portions 51 are arranged at the second arrangement pitch B that is smaller than the arrangement pitch of the electrically conductive particles 71 are repeated in the X direction and in the Y direction.

According to this configuration, the two types of arrangement pitches that differ from each other are repeated with respect to the arrangement pitch of the electrically conductive particles 71 and hence, in a terminal portion 40i illustrated in FIG. 18, it is possible to prevent at least 50% of electrically conductive particles 71 from falling into the recessed portions 51 in each column of the electrically conductive particles 71. The large number of electrically conductive particles 71 do not fall into the recessed portions 51 and hence, proper pressing can be applied to the large number of electrically conductive particles 71. In a terminal portion 40j illustrated in FIG. 19, three out of four, that is, approximately 75% of electrically conductive particles 71 can be prevented from falling into the recessed portions 51.

Fifth Modification Example

Figure 20:
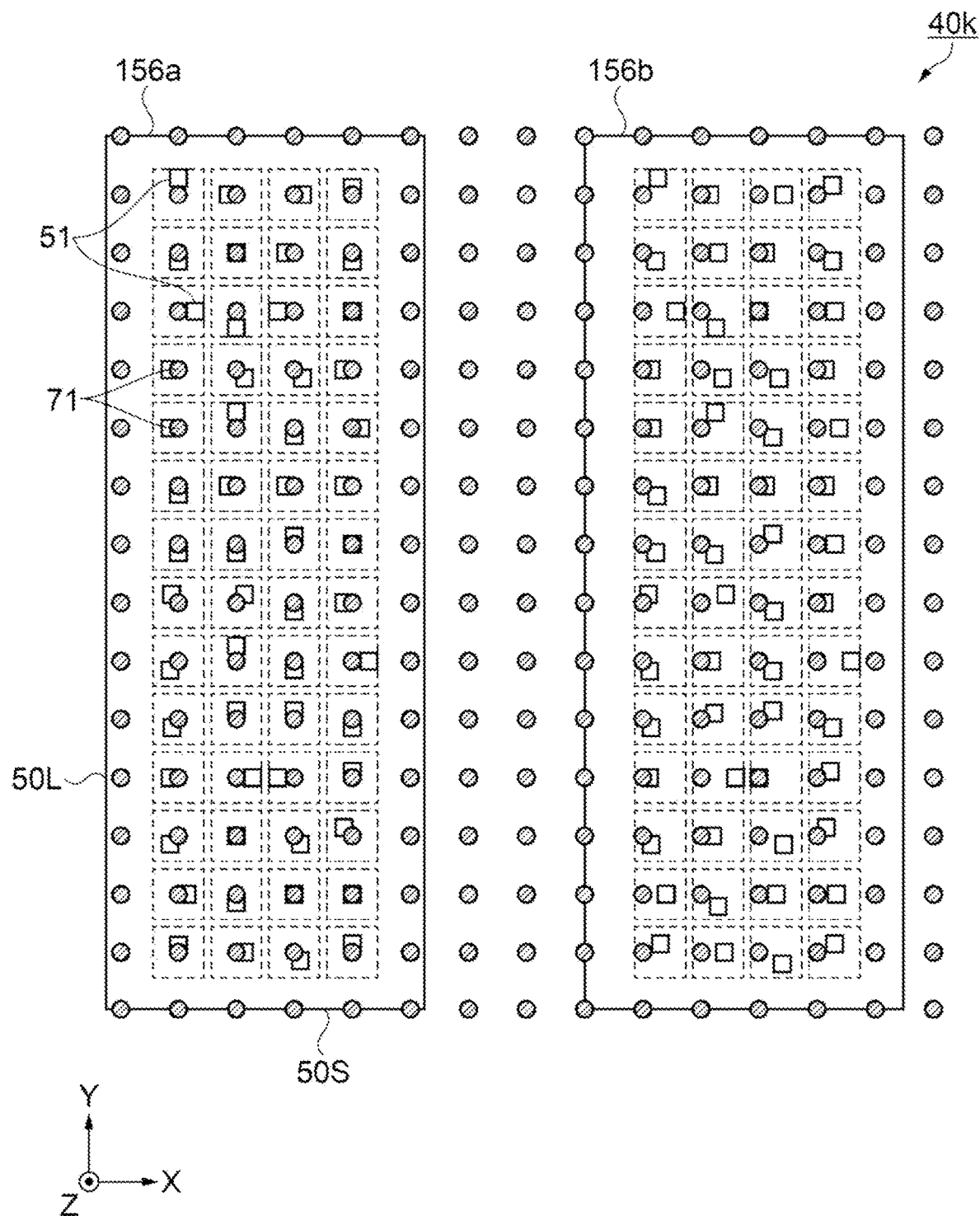
FIG. 20 is a plan view illustrating a configuration of a connection terminal portion according to a fifth modification example.
Figure 21:
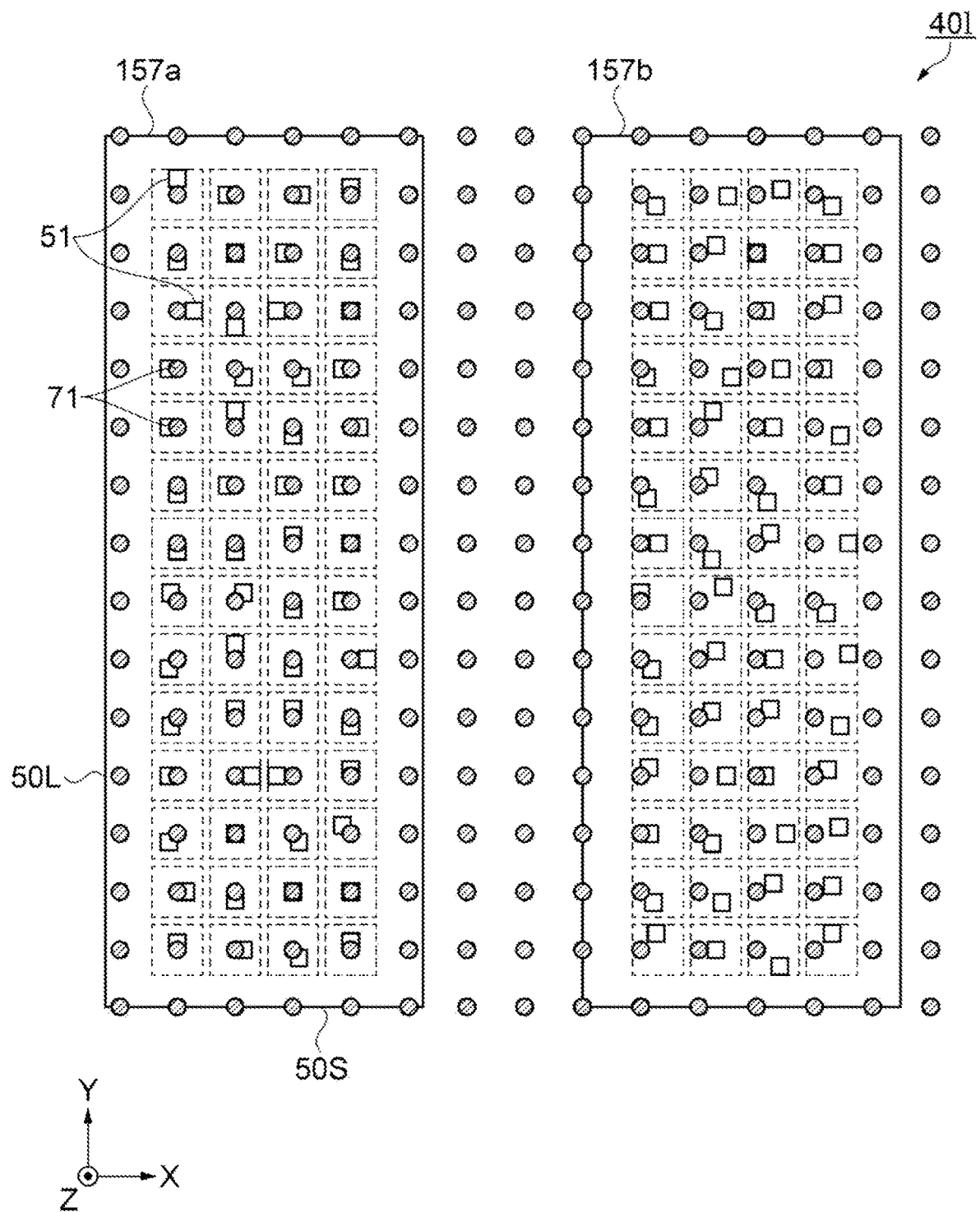
FIG. 21 is a plan view illustrating a configuration of a connection terminal portion according to another mode of the fifth modification example.

Additionally, an arrangement of the recessed portions 51 is not limited to the arrangements described in the second embodiment, the third embodiment and the above-mentioned modification examples, and the recessed portions 51 may be arranged at random as in the case of the fifth modification example illustrated in FIG. 20 and FIG. 21. The fifth modification example illustrated in FIG. 20 shows a configuration where a virtual frame is set for each electrically conductive particle 71, and a recessed portion 51 is arranged at random within a range of the frame. The arrangement of the recessed portions 51 of a first connection terminals 156a and the arrangement of recessed portions 51 of a second connection terminals 156b are set equal to each other.

The electrically conductive particles 71 are regularly arranged in a matrix array in parallel to a long side 50L of the first connection terminal 156a and in a predetermined arrangement pattern. The virtual frame has a square shape with a side of 9 μm, for example. An arrangement pitch of the virtual frames is 10 μm, for example. The recessed portion 51 has a square shape with a side of 2 μm, for example. The positions of the recessed portions 51 are moved by changing coordinates of the recessed portions 51 using random numbers. With respect to the size of the virtual frame, a length of one side of the square shape is 9 μm and hence, assuming center coordinates of the virtual frame as an origin, the recessed portion 51 can move within a range of ±3.5 μm in XY coordinates. While the arrangement pitch of the virtual frame is 10 μm, the virtual frame is formed in a square shape with a side of 9 μm and hence, at least 1 μm is guaranteed as a space between the recessed portions 51 included in the adjacent virtual frames respectively. Such setting of the sizes is an example of treatment for observing the rules on spaces of the connection structure where the recessed portions 51 are formed.

Accordingly, by determining the X coordinate correction value (=−3.5 μm to +3.5 μm) and the Y coordinate correction value (=−3.5 μm to +3.5 μm) at random, the random arrangement of the recessed portions 51 can be realized. When the coordinate correction value is set to a value equal to or larger than a radius that is a half of an average diameter of the electrically conductive particles 71, the probability that falling of the electrically conductive particles 71 into the recessed portions 51 can be prevented is increased. For example, when a diameter of the electrically conductive particle 71 is set to 3 μm, the recessed portion 51 can optionally take 5 positions in the X coordinate and can optionally take 5 positions in the Y coordinate and hence, the recessed portion 51 can be arranged in 25 patterns in total within the virtual frame.

In the fifth modification example illustrated in FIG. 21 the recessed portions 51 are arranged at random within the virtual frame, and the arrangement of the recessed portions 51 on a first connection terminal 157a and the arrangement of the recessed portions 51 on a second connection terminal 157b are made different from each other. That is, the different connection terminals 157a, 157b adopt the different random arrangements in arranging the recessed portions 51. By disposing the recessed portions 51 in this manner, the probability that the aligned electrically conductive particles 71 fall into the recessed portions 51 is largely reduced. Further, since the recessed portions 51 are arranged at random by setting the virtual frames, the number of connection structures per unit area is not changed. Accordingly, the electrical connection resistances of the respective connection terminals 157a and 157b can be made uniform to a degree that the difference in the electrical connection resistance can be made substantially ignorable.

By configuring the terminal portions 40k, 40l as described above, the arrangement of the recessed portions 51 can be randomized and hence, the probability that the aligned electrically conductive particles 71 fall into the recessed portions 51 is largely reduced. Such a configuration is effective regardless of the arrangement method of the electrically conductive particles 71 and hence, the electro-optical device can flexibly cope with the various arrangements of the electrically conductive particles 71 of the particle aligned type anisotropic conductive film 70.

Sixth Modification Example

Figure 22:
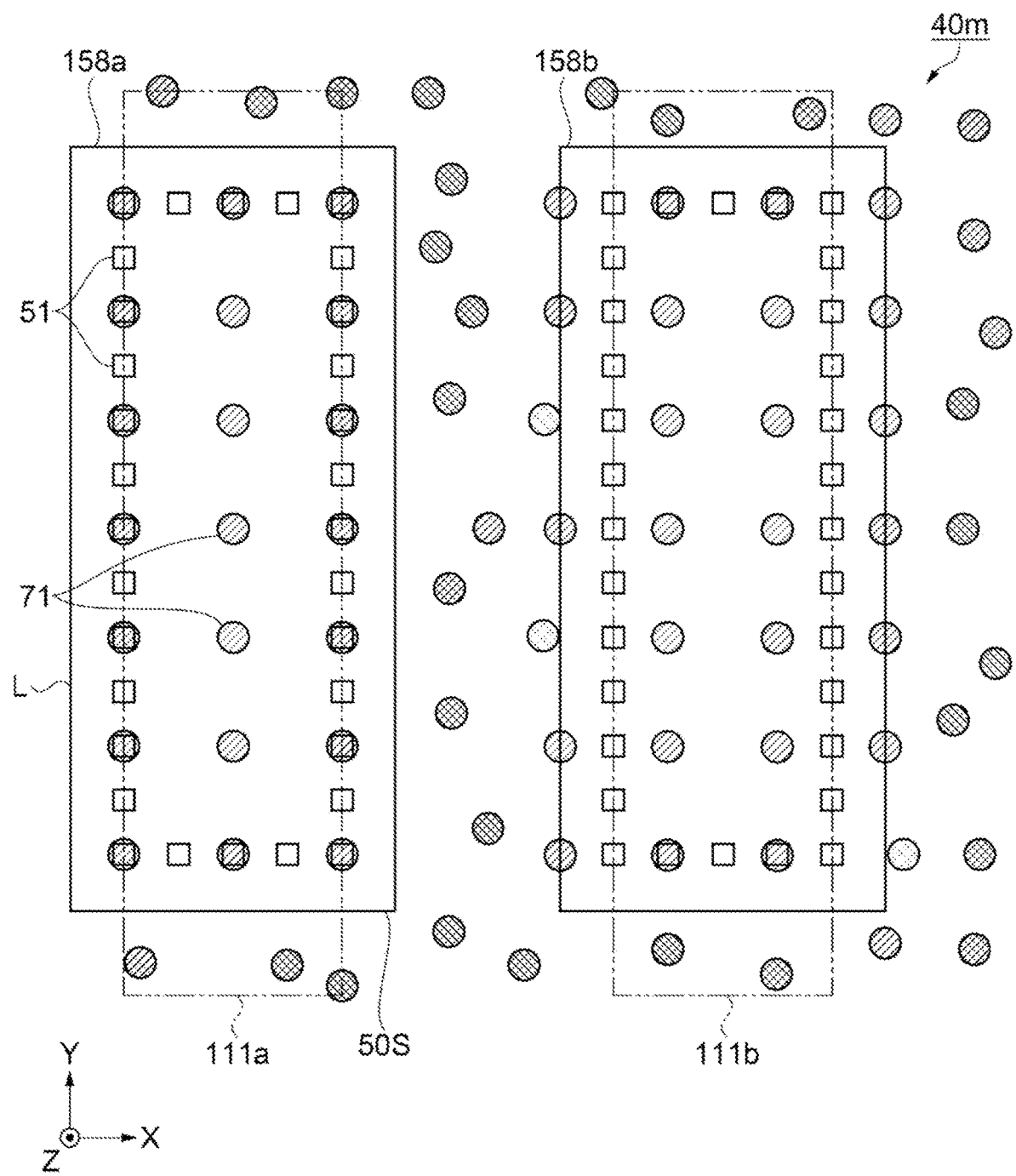
FIG. 22 is a plan view illustrating a configuration of a connection terminal portion according to a sixth modification example.
Figure 23:
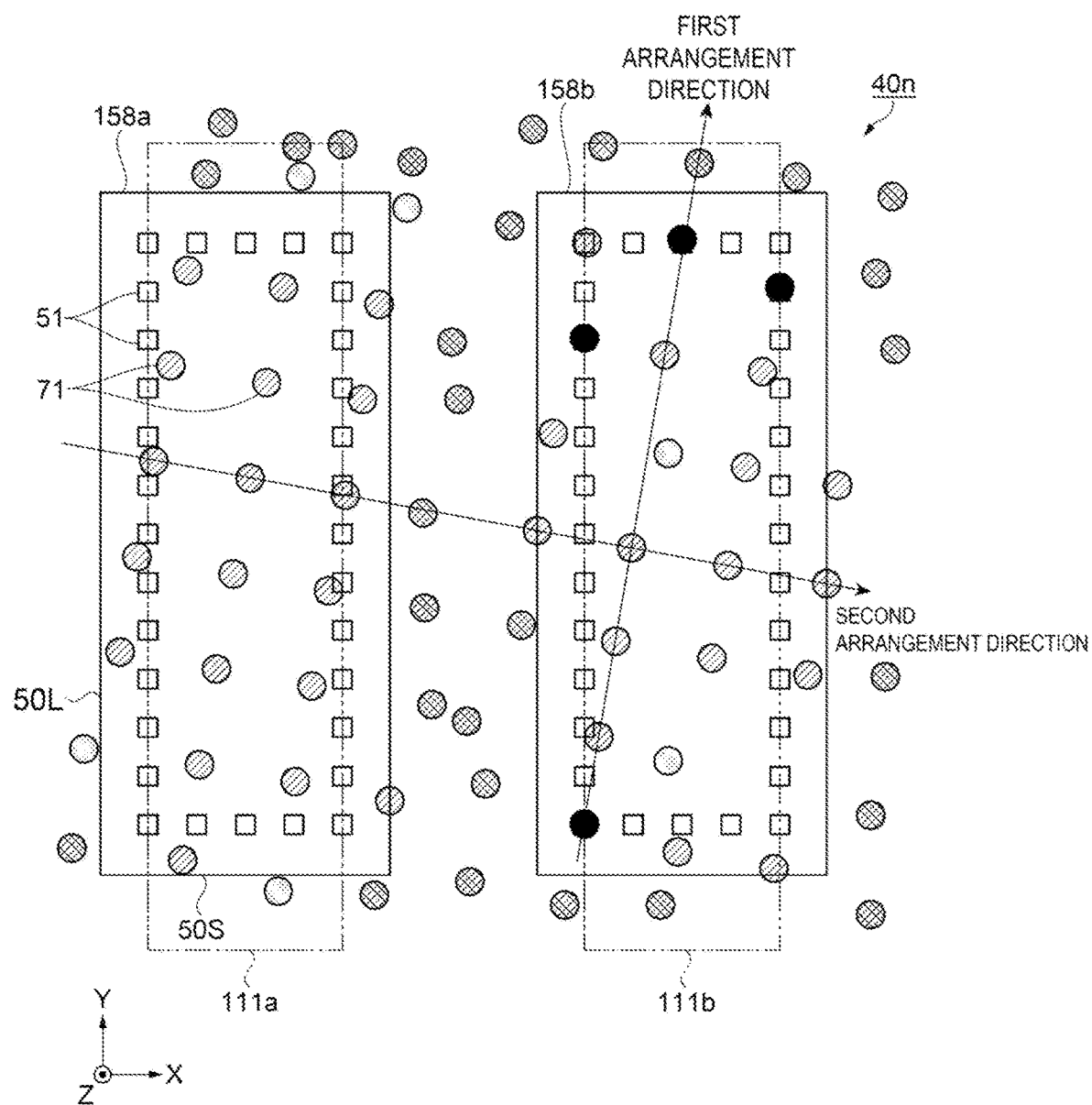
FIG. 23 is a plan view illustrating a configuration of a connection terminal portion according to another mode of the sixth modification example.
Figure 24:
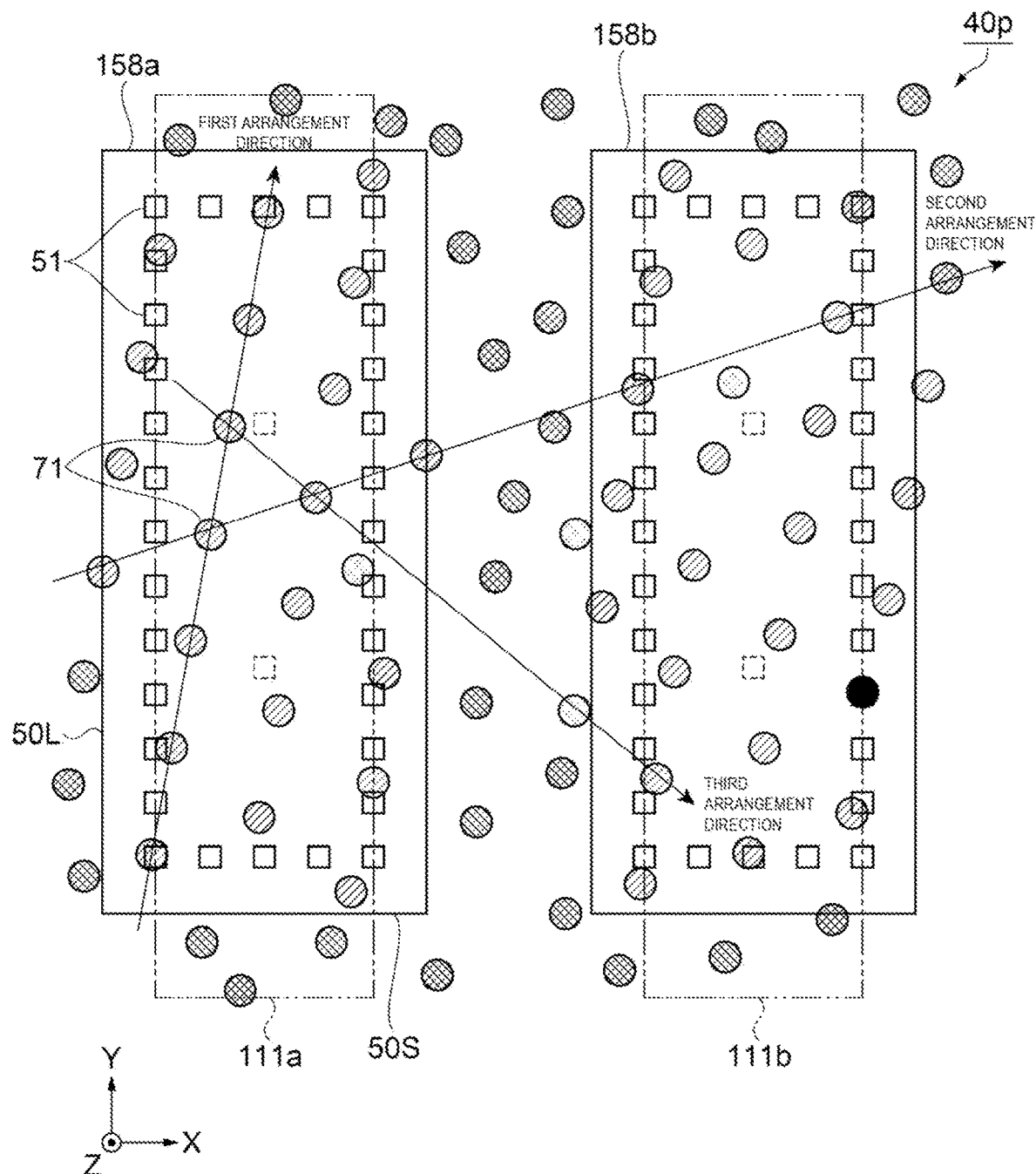
FIG. 24 is a plan view illustrating a configuration of a connection terminal portion according to another mode of the sixth modification example.

The arrangement of the recessed portions 51 is not limited to the above-described embodiments and the above-mentioned modification examples, and the recessed portions 51 may be arranged as described in the sixth modification example illustrated in FIG. 22 to FIG. 24. FIG. 22 to FIG. 24 are plan views illustrating configurations of connection terminal portions 40m, 40n, and 40p according to the sixth modification example. In the connection terminal portion 40m illustrated in FIG. 22, recessed portions 51 are arranged along an outer shape of a first connection terminal 158a. An arrangement pitch of the recessed portion 51 is 5 µm, for example. Electrically conductive particles 71 are regularly arranged in a matrix array in parallel to a long side 50L of the first connection terminal 158a and in a predetermined arrangement pattern. An arrangement pitch of the electrically conductive particles 71 is 10 µm, for example.

With such a configuration, in the worst case, the electrically conductive particles 71 fall into the recessed portions 51 arranged along the outer shape of the first connection terminal 158a. However, the recessed portion 51 is not arranged at the center portion of the first connection terminal 158a and hence, the electrically conductive particles 71 remain at the center portion, and proper pressing is applied to the remaining electrically conductive particles 71 thus ensuring the electrical connection between the first connection terminal 158a and a copper foil pattern forming external terminals 111a, 111b of a printed circuit board 110. Further, the recessed portions 51 are arranged along the outer shape of the first connection terminal 158a and hence, in a case of using the first connection terminal 158a having a narrow width, even when an electrode layer forming an uppermost layer of the first connection terminal 158a is made of a material having a relatively high sheet resistance such as ITO, for example, a distance from the center portion of the first connection terminal 158a to each of the recessed portions 51 (connection structures) arranged along the long side 50L is short and hence, the first connection terminal 158a can be connected to a wiring layer disposed below the first connection terminal 158a with low resistance.

The connection terminal portion 40n illustrated in FIG. 23 differs from the connection terminal portion 40m illustrated in FIG. 22 in that an arrangement of the electrically conductive particles 71 includes both the arrangement of the electrically conductive particles 71 in a first arrangement direction intersecting with a long side 50L of a first connection terminal 158a and the arrangement of the electrically conductive particles 71 in a second arrangement direction intersecting with a short side 50S of the first connection terminal 158a. According to this configuration, when the electrically conductive particles 71 are viewed in a projection view in a direction of the long side 50L of the first connection terminal 158a, the electrically conductive particles 71 adjacent to each other appear in an overlapping manner with each other. Accordingly, such a configuration acts as if there is a virtual electrical connection region diagonally traversing the first connection terminal 158a. Further, in the first connection terminal 158a and the second connection terminal 158b, a change in quantity or number of electrically conductive particles 71 existing in a region disposed at a center portion of the terminal where the recessed portions 51 are not formed can be reduced and hence, the first connection terminal 158a and the second connection terminal 158b can have the similar electrical connection performances.

The terminal portion 40p illustrated in FIG. 24 has a configuration where an arrangement of electrically conductive particles 71 includes both an arrangement in a first arrangement direction and an arrangement in a second arrangement direction as illustrated in FIG. 23 and, in addition, includes an arrangement in a third arrangement direction intersecting with the first arrangement direction and the second arrangement direction.

In the modification examples illustrated in FIG. 22 to FIG. 24, the recessed portion 51 is not arranged at the center portion of the connection terminal 158a (158b). However, the recessed portion 51 (indicated by a broken line) may be arranged near the center of the connection terminal 158a such that the number of the recessed portions 51 (indicated by a broken line) is less than the number (density) of recessed portions 51 arranged along the outer shape of the connection terminal 158a. For example, in the modification example of FIG. 24, although the recessed portions 51 arranged along the outer shape of the connection terminal 158a have an arrangement pitch of 5 µm, a plurality of recessed portions 51 may be arranged at the center portion of the connection terminal 158a in the Y direction at an arrangement pitch of 20 µm to 100 µm, for example. Such arrangement may be randomized. In any case, in the connection terminal 158a (158b), the number (density) of the recessed portions 51 arranged at the center portion is less than the number (density) of the recessed portions 51 arranged at the peripheral portion. Even with such a configuration, the probability that the electrically conductive particles 71 at the center portion fall into the recessed portions 51 can be reduced and hence, proper pressing can be applied to the large number of electrically conductive particles 71 thus ensuring the electrical connection between the connection terminal 158a (158b) and the copper foil pattern forming the external terminal 111a (111b) of the printed circuit board 110. The fact that the recessed portion 51 is arranged at the center portion is a result of adding the connection structure and hence, the electrical connection between the electrode layer forming the uppermost layer and the wiring layer below the electrode layer is strengthened.

In the embodiments, although the description has been made with respect to the configuration that the printed circuit board 110 is mounted on the connection terminals 50a and 50b formed on the element substrate 10 that forms the liquid crystal panel 100, the present disclosure is not limited to such a configuration. The present disclosure may also be applicable to a configuration of a Chip On Glass (COG) where a driving integrated circuit is mounted on connection terminals 50a and 50b formed on the element substrate 10.

Further, the electro-optical device to which the present disclosure is applied is not limited to the liquid crystal device 500 described above, for example, and the present disclosure may also be applicable to an organic EL device, a plasma display, an electronic paper (EPD) or the like.

What is claimed is:

1. An electro-optical device comprising:
    an anisotropic conductive film having a plurality of electrically conductive particles that are arranged along a first direction and a second direction intersecting with the first direction in plan view; and
    an electro-optical panel including a plurality of terminals coupled to a flexible wiring substrate via the anisotropic conductive film,
    wherein the plurality of terminals includes a plurality of recessed portions, the plurality of recessed portions including first recessed portion and second recessed portion, and
    wherein the first recessed portion and the second recessed portion are arranged along a third direction intersecting with the first direction and the second direction in plan view, the plurality of terminals includes a first terminal and a second terminal, the first terminal has the first recessed portion, and the second terminal has the second recessed portion, wherein the first terminal includes a first electrode layer and a first wiring layer, the first electrode layer is electrically connected to first electrically conductive particles among the plurality of electrically conductive particles, the first wiring layer is electrically connected to the first electrode layer via a first through hole, the second terminal includes a second electrode layer and a second wiring layer, the second electrode layer is electrically connected to second electrically conductive particles among the plurality of electrically conductive particles, the second wiring layer is electrically connected to the second electrode layer via a second through hole, the first recessed portion is formed on the first electrode layer along the first through hole, and the second recessed portion is formed on the second electrode layer along the second through hole.

2. The electro-optical device according to claim 1, wherein the first terminal further has a third recessed portion.

3. The electro-optical device according to claim 2, wherein the first terminal and the second terminal are arranged along a fourth direction intersecting with the third direction in plan view.

4. The electro-optical device according to claim 2, wherein the first terminal is extended along the third direction.

5. The electro-optical device according to claim 2, wherein the plurality of recessed portions are arranged at a first pitch, the plurality of electrically conductive particles are arranged at a second pitch, and the first pitch is different from the second pitch.

6. The electro-optical device according to claim 5, wherein the first pitch is smaller than the second pitch.

7. The electro-optical device according to claim 1, wherein the first terminal and the second terminal are arranged along the third direction.

8. The electro-optical device according to claim 1, wherein a width of the first recessed portion and a width of the second recessed portion are smaller than a diameter of an electrically conductive particle.

9. The electro-optical device according to claim 1, wherein the plurality of electrically conductive particles include electrically conductive particles arranged in a fifth direction intersecting with the first direction and the second direction.

10. The electro-optical device according to claim 9, wherein the third direction is intersecting with the fifth direction.

11. An electronic apparatus, comprising:

the electro-optical device according to claim 1.

* * * * *